(12) United States Patent
Yabuta et al.

(10) Patent No.: US 9,022,534 B2
(45) Date of Patent: May 5, 2015

(54) PIEZOELECTRIC MATERIAL, PIEZOELECTRIC ELEMENT, LIQUID DISCHARGE HEAD, ULTRASONIC MOTOR, AND DUST REMOVING DEVICE

(71) Applicant: Canon Kabushiki Kaisha, Tokyo (JP)

(72) Inventors: Hisato Yabuta, Machida (JP); Takayuki Watanabe, Yokohama (JP); Makoto Kubota, Yokohama (JP); Jumpei Hayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/372,549

(22) PCT Filed: Mar. 8, 2013

(86) PCT No.: PCT/JP2013/057325
§ 371 (c)(1),
(2) Date: Jul. 16, 2014

(87) PCT Pub. No.: WO2013/137421
PCT Pub. Date: Sep. 19, 2013

(65) Prior Publication Data
US 2014/0354738 A1    Dec. 4, 2014

(30) Foreign Application Priority Data

Mar. 14, 2012  (JP) ................................. 2012-057403

(51) Int. Cl.
*B41J 2/045*    (2006.01)
*H01L 41/187*    (2006.01)
(Continued)

(52) U.S. Cl.
CPC ......... *H01L 41/1878* (2013.01); *B41J 2/14233* (2013.01); *H01L 41/187* (2013.01);
(Continued)

(58) Field of Classification Search
CPC ............... B41J 2/14201; B41J 2/14233; B41J 2/14274; B41J 2/14282; B41J 2/161; B41J 2/1612
USPC .................................................. 347/68, 70, 71
See application file for complete search history.

(56) References Cited

U.S. PATENT DOCUMENTS 7,591,543 B2 * 9/2009 Aoki et al. ..................... 347/68
7,857,431 B2 * 12/2010 Fukui et al. ................... 347/68
(Continued)

FOREIGN PATENT DOCUMENTS

JP    2007-287739 A    11/2007
WO   2012/091147 A1    7/2012

OTHER PUBLICATIONS

Saburo Nagakura et al. (ed.), Iwanami Dictionary of Physics and Chemistry, 5th Edition, p. 1268-1269 (Iwanami Shoten, Publishers; Feb. 20, 1998).

(Continued)

*Primary Examiner* — Juanita D Jackson
(74) *Attorney, Agent, or Firm* — Fitzpatrick, Cella, Harper & Scinto

(57) ABSTRACT

Provided is a piezoelectric material having high Curie temperature, high insulation property, and high piezoelectric performance, the piezoelectric material including a perovskite-type metal oxide represented by the general formula (1): $xBaTiO_3$-$yBiFeO_3$-$zBi(M_{0.5}Ti_{0.5})O_3$, where M represents at least one kind of element selected from the group consisting of Mg, Ni, and Zn, x represents a value satisfying $0.25 \leq x \leq 0.75$, y represents a value satisfying $0.15 \leq y \leq 0.73$, and z represents a value satisfying $0.02 \leq z \leq 0.60$, provided that $x+y+z=1$ is satisfied in which the perovskite-type metal oxide contains V, and content of the V is 0.0005 mol or larger and 0.0050 mol or smaller with respect to 1 mol of the perovskite-type metal oxide. In addition, provided are a piezoelectric element, a liquid discharge head, an ultrasonic motor, and a dust removing device, which use the piezoelectric material.

23 Claims, 13 Drawing Sheets

(51) Int. Cl.
  *B41J 2/14* (2006.01)
  *H01L 41/43* (2013.01)
  *H01L 41/08* (2006.01)
  *H01L 41/083* (2006.01)
  *H02N 2/10* (2006.01)
  *H02N 2/16* (2006.01)
  *B05B 17/06* (2006.01)
  *H01L 41/047* (2006.01)
  *G02B 7/10* (2006.01)

(52) U.S. Cl.
  CPC ............ *H01L41/1871* (2013.01); *H01L 41/43* (2013.01); *G02B 7/102* (2013.01); *H01L 41/0805* (2013.01); *H01L 41/083* (2013.01); *H02N 2/106* (2013.01); *H02N 2/163* (2013.01); *B05B 17/0607* (2013.01); *B41J 2/045* (2013.01); *H01L 41/0477* (2013.01); *H02N 2/103* (2013.01)

(56) References Cited

U.S. PATENT DOCUMENTS

| | | | |
|---|---|---|---|
| 7,896,480 B2 * | 3/2011 | Kazama et al. | 347/68 |
| 2013/0056671 A1 | 3/2013 | Kubota et al. | |
| 2013/0270965 A1 | 10/2013 | Hayashi et al. | |

OTHER PUBLICATIONS

M. Mahesh Kumar et al., "Structure Property Relations in BiFeO3/BaTiO3 Solid Solutions," 87(2) J. Appl. Phys. 855-862 (Jan. 2000).

Hemant Singh et al., "Structural, dielectric, magnetic, magnetodielectric and impedance spectroscopic studies of multiferroic BiFeO3—BaTiO3 ceramics," 176(7) Mater. Sci. Eng. B 540-547 (Apr. 2011).

* cited by examiner

PIEZOELECTRIC MATERIAL, PIEZOELECTRIC ELEMENT, LIQUID DISCHARGE HEAD, ULTRASONIC MOTOR, AND DUST REMOVING DEVICE

TECHNICAL FIELD

The present invention relates to a piezoelectric material, and more particularly, to a lead-free piezoelectric material. The present invention also relates to a piezoelectric element, a liquid discharge head, an ultrasonic motor, and a dust removing device, which use the piezoelectric material.

BACKGROUND ART

A commonly used piezoelectric material is an $ABO_3$-type perovskite metal oxide such as lead zirconate titanate (hereinafter referred to as "PZT"). However, it is considered that PZT, which contains lead as an A-site element, may cause environmental problems. Therefore, a piezoelectric material with a lead-free perovskite-type metal oxide has been desired.

Barium titanate is known as a piezoelectric material of a lead-free perovskite-type metal oxide. PTL 1 discloses barium titanate prepared by two-step sintering technique using a resistance heating apparatus. PTL 1 describes that a ceramics with excellent piezoelectric property can be obtained when nano-sized barium titanate powder is sintered by the two-step sintering technique. However, the barium titanate has a problem in that it is not suitable for device operation at high temperature because its Curie temperature is as low as 125° C.

In addition, NPL 1 discloses a solid solution of barium titanate and bismuth ferrite as an attempt to increase the Curie temperature of barium titanate. However, as the solid solution amount of the bismuth ferrite increases, the Curie temperature increases while piezoelectric performance is conspicuously decreased. At the same time, there has been a problem in that the DC conductivity increases, that is, the insulation property deteriorates.

In other words, it is difficult to achieve all high Curie temperature, high piezoelectric performance, and high insulation property at the same time in a piezoelectric material of the lead-free perovskite-type metal oxide.

CITATION LIST

Patent Literature

PTL 1: Japanese Patent Application Laid-Open No. 2007-287739

NPL 1: "Journal of Applied Physics" 2000, Volume 87, Issue 2, pp. 855-862

NPL 2: Iwanami Physicochemical Dictionary, Fifth Edition (Iwanami Shoten, published on Feb. 20, 1998)

SUMMARY OF INVENTION

Technical Problem

The present invention has been made to solve this problem, and provides a piezoelectric material achieving all high Curie temperature, high piezoelectric performance, and high insulation property.

In addition, the present invention provides a piezoelectric element, a liquid discharge head, an ultrasonic motor, and a dust removing device, which use the piezoelectric material.

Solution to Problem

A piezoelectric material according to an exemplary embodiment of the present invention includes a perovskite-type metal oxide represented by the following general formula (1):

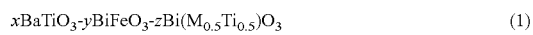

$$xBaTiO_3\text{-}yBiFeO_3\text{-}zBi(M_{0.5}Ti_{0.5})O_3 \qquad (1)$$

where M represents at least one kind of element selected from the group consisting of Mg, Ni, and Zn, x represents a value satisfying $0.25 \le x \le 0.75$, y represents a value satisfying $0.15 \le y \le 70.73$, and z represents a value satisfying $0.02 \le z \le 0.60$, provided that $x+y+z=1$ is satisfied. The perovskite-type metal oxide contains vanadium (V), and content of the V is 0.0005 mol or larger and 0.0050 mol or smaller with respect to 1 mol of the perovskite-type metal oxide.

A piezoelectric element according to an exemplary embodiment of the present invention includes: a first electrode; a piezoelectric material; and a second electrode in which the piezoelectric material is the above-mentioned piezoelectric material.

A liquid discharge head according to an exemplary embodiment of the present invention uses the above-mentioned piezoelectric element.

An ultrasonic motor according to an exemplary embodiment of the present invention uses the above-mentioned piezoelectric element.

A dust removing device according to an exemplary embodiment of the present invention uses the above-mentioned piezoelectric element.

Advantageous Effects of Invention

According to the present invention, it is possible to provide the piezoelectric material achieving all high Curie temperature, high piezoelectric performance, and high insulation property.

Through the use of the piezoelectric material of the present invention, it is possible to provide the liquid discharge head having the same or higher nozzle density and discharge capacity than the case where a piezoelectric material containing lead is used.

Through the use of the piezoelectric material of the present invention, it is possible to provide the ultrasonic motor having the same or higher driving power and durability than the case where a piezoelectric material containing lead is used.

Through the use of the piezoelectric material of the present invention, it is possible to provide the dust removing device having the same or higher dust removing efficiency than in the case where a piezoelectric material containing lead is used.

Further features of the present invention will become apparent from the following description of exemplary embodiments with reference to the attached drawings.

DESCRIPTION OF EMBODIMENTS

Figure 1A:
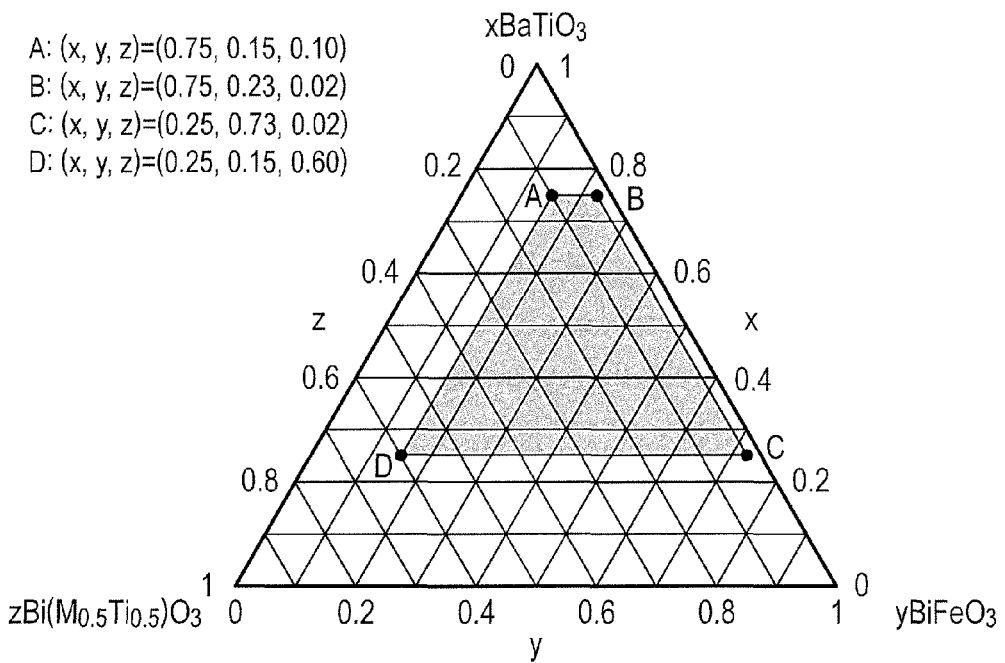
FIG. 1A is a phase diagram illustrating a piezoelectric material according to an embodiment of the present invention.

In the following, exemplary embodiments of the present invention are described.

According to an exemplary embodiment of the present invention, there is provided a piezoelectric material containing a perovskite-type metal oxide represented by the following general formula (1):

$$xBaTiO_3\text{-}yBiFeO_3\text{-}zBi(M_{0.5}Ti_{0.5})O_3 \qquad (1)$$

where M represents at least one kind of element selected from the group consisting of Mg, Ni, and Zn, x represents a value satisfying $0.25 \le x \le 0.75$, y represents a value satisfying $0.15 \le y \le 0.73$, and z represents a value satisfying $0.02 \le z \le 0.60$, provided that $x+y+z=1$ is satisfied, in which the perovskite-type metal oxide contains V, and content of the V is 0.0005 mol or larger and 0.0050 mol or smaller with respect to 1 mol of the perovskite-type metal oxide.

The perovskite-type metal oxide of the present invention refers to a metal oxide having a perovskite-type structure that is ideally a cubic structure as described in NPL 2. The metal oxide having a perovskite-type structure is generally represented by a chemical formula of $ABO_3$. In the perovskite-type metal oxide, the elements A and B occupy specific positions in a form of ions in a unit cell, which are called A site and B site. For example, in a cubic unit cell, the element A is positioned at a vertex of the cube while the element B occupies the body-centered position of the cube. The element O occupies a face center position as an anion of oxygen.

The metal oxide represented by the general formula (1) refers to a solid solution of three perovskite-type metal oxides that are represented by $BaTiO_3$, $BiFeO_3$, and $Bi(M_{0.5}Ti_{0.5})O_3$. In the general formula (1), a metal element positioned at the A site is mainly Ba and Bi, and a metal element positioned at the B site is Ti, Fe, and M, where M represents at least one kind of element selected from the group consisting of Mg, Ni, and Zn.

In the general formula (1), an element content ratio between the A site and the B site is expressed as 1:1. However, even if the element content ratio is shifted slightly, a single phase state constituted of only the perovskite-type structure is included within the scope of the present invention. For example, in a lead type piezoelectric material, it is well known that an actual B-site element ratio is often shifted from a stoichiometric ratio when A-site Pb is excessively used or in a composite perovskite-type structure.

In the general formula (1), M in $Bi(M_{0.5}Ti_{0.5})O_3$ represents at least one kind of element selected from the group consisting of Mg, Ni, and Zn. The element M may be only Mg, may be only Ni, may be only Zn, may include any two kinds of the elements, or may include all the elements. The element M has a valence of two and thus keeps an electrically neutral condition for $Bi(M_{0.5}Ti_{0.5})O_3$ together with tetravalent Ti and trivalent Bi. At this time, a ratio between M and Ti is preferably 1 to 1. Further, in the general formula (1), the element amounts of M and Ti in $Bi(M_{0.5}Ti_{0.5})O_3$ are both described as 0.5. However, even when the amounts are shifted to values within the range of 0.4 to 0.6, a single phase state constituted only of the perovskite-type structure falls within the scope of the present invention.

Further, the piezoelectric material of the present invention may contain property modifiers, and inevitable impurities resulting from its manufacturing process. The content of components other than the elements shown in the general formula (1) and V in the piezoelectric material of the present invention is preferably 2 parts by weight or less, more preferably 1 part by weight or less, with respect to 100 parts by weight of the entire piezoelectric material.

It may be determined that the piezoelectric material is the perovskite-type structure from structure analysis using X-ray diffraction or electron diffraction, for example.

In the general formula (1), the range of x, which represents the abundance of $BaTiO_3$, is $0.25 \leq x \leq 0.75$, preferably $0.25 \leq x \leq 0.55$. Further, the range of y, which represents the abundance of $BiFeO_3$, is $0.15 \leq y \leq 0.70$, preferably $0.20 \leq y \leq 0.70$.

Regarding the abundance of $BaTiO_3$, when x represents more than 0.75, the Curie temperature becomes less than 200° C., with the result that the piezoelectricity may disappear at high operation temperatures. Alternatively, even when the disappearance of the piezoelectricity does not occur, a property variation due to an operation temperature variation is remarkable, with the result that the property variation may deviate from its allowable range when the material is used in a device.

In this specification, the "Curie temperature" refers to the temperature at which ferroelectricity disappears. As a method of specifying the Curie temperature, there are a method of directly measuring the temperature at which ferroelectricity disappears with sweeping temperature, and a method in which a dielectric constant is measured by using micro alternating electric field of a certain frequency with sweeping temperature to thereby determine the temperature at which the dielectric constant becomes maximum.

A desirable Curie temperature in the piezoelectric material of the present invention is 200° C. or more and 500° C. or less, more preferably, 200° C. or more and 450° C. or less. If the Curie temperature is 200° C. or more, it is possible to provide a material with little property variation due to the temperature when the material is used in a device. In addition, when the Curie temperature is 500° C. or less, it is possible to provide a material that is easy to polarize when the material is used in an element.

In addition, when x represents less than 0.25 and the abundance of $BiFeO_3$ is large (e.g., y>0.30), a crystal phase other than the perovskite-type structure (the crystal phase other than the perovskite-type structure is hereinafter referred to as "secondary phase") may be formed, resulting in a reduction in piezoelectric property. Further, when x represents less than 0.25 and the abundance of $BiFeO_3$ is small (e.g., y≤70.30), even the piezoelectric material without V (doping) has satisfactory insulation property, and thus an insulation property improving effect at the time of V doping is small.

Regarding the abundance of $BiFeO_3$, when y represents less than 0.15 and the abundance of $BaTiO_3$ is large (e.g., x≥0.50), the Curie temperature may lower. Further, when y represents less than 0.15 and the abundance of $BaTiO_3$ is small (e.g., x≤0.50), a secondary phase may be formed.

In the general formula (1), the range of z, which represents the abundance of $Bi(M_{0.5}Ti_{0.5})O_3$, is $0.02 \leq z \leq 0.60$, preferably $0.02 \leq z \leq 0.25$. When z represents less than 0.02 and the abundance of $BaTiO_3$ is large (e.g., x≥0.50), the Curie temperature may lower. Further, when z represents less than 0.02 and the abundance of $BaTiO_3$ is small (e.g., x≤0.50), a reduction in insulation property may occur. The reduction in insulation property is such that even when the V doping of the present invention is performed, the insulation property falls short of desired one, that is, the material cannot resist the application of a high DC electric field in polarization treatment.

In the general formula (1), when $0.25 \leq x \leq 0.75$, $0.15 \leq y \leq 0.73$, and $0.02 \leq z \leq 0.60$ are satisfied, it can be said that x, y, and z are within the range surrounded by the following coordinate points A, B, C, D, and E. Note that, points on the lines connecting the respective coordinate points are within the above-mentioned range.

The values (x, y, z) of the respective coordinate points are as follows.
A: (x, y, z)=(0.75, 0.15, 0.10)
B: (x, y, z)=(0.75, 0.23, 0.02)
C: (x, y, z)=(0.25, 0.73, 0.02)
D: (x, y, z)=(0.25, 0.15, 0.60)

FIG. 1A is a triangle phase diagram illustrating compositional ranges of the piezoelectric material according to the present invention. The thick solid lines and regions surrounded by the lines indicate the compositional ranges of the present invention. The portion surrounded by the coordinate points A, B, C, D, and A indicates the compositional range of the metal oxide to be used in the piezoelectric material of the present invention, and excellent piezoelectric property is exhibited in the compositional range. The filled circles and solid lines are meant to fall within the compositional range. When V is incorporated in an amount of 0.0005 mol or more and 0.0050 mol or less, more preferably 0.0010 mol or more and 0.0040 mol or less, with respect to 1 mol of the perovskite-type metal oxide represented by the general formula (1) satisfying the compositional range, a piezoelectric material which has a high Curie temperature and high piezoelectricity and which exhibits high insulation property can be obtained. Note that, the term "insulation property" as used herein refers to electric resistance at the time of the application of an AC or DC electric field to a piezoelectric material. In particular, the term refers to electric resistance to a DC electric field which requires higher resistance. For example, the term refers to resistance to the application of a high DC electric field (e.g., 1 kV/cm or more) to be used in the polarization treatment of a piezoelectric material. A piezoelectric material, which is obtained by doping V satisfying the above-mentioned range into a perovskite-type metal oxide satisfying the above-mentioned compositional range, has a piezoelectric constant $d_{33}*$ of 110 [pm/V] or more and has a Curie temperature of 200° C. or more. In addition, the piezoelectric material has such insulation property that the material can resist the application of a DC electric field of 50 kV/cm or more for several minutes to several hours. An improvement in the insulation property also contributes to an improvement in piezoelectric performance because it allows a higher electric field to be applied to a piezoelectric material.

In this specification, the piezoelectric constant $d_{33}*$ is a constant determined from the electric field and strain slope of an electric field-strain curve. Here, mark * is added for the following reason. The piezoelectric constant $d_{33}$ that is usually used shows piezoelectric property only in 33-direction. In contrast, in this calculation method, there is a slight possibility of contribution to directions other than the 33-direction.

When V is doped in an amount of less than 0.0005 mol with respect to 1 mol of the perovskite-type metal oxide represented by the general formula (1) satisfying the above-mentioned compositional range illustrated in FIG. 1A, an insulation property improving effect of V doping (on the perovskite-type metal oxide) is small.

Similarly, even when V is doped in an amount of more than 0.0050 mol with respect to 1 mol of the perovskite-type metal oxide represented by the general formula (1) satisfying the compositional range illustrated in FIG. 1A, an insulation property improving effect of V doping (on the perovskite-type metal oxide) is small. Further, a non-negligible amount of a secondary phase appears in a produced material, resulting in a reduction in piezoelectricity.

In the present invention, it is more preferred that the ranges of x, y, and z in the general formula (1) be $0.25 \leq x \leq 0.55$, $0.20 \leq y \leq 0.73$, and $0.02 \leq z \leq 0.25$, respectively.

The above-mentioned ranges can also be expressed as follows: x, y, and z fall within the range surrounded by the following coordinate points E, F, G, and H.

The values (x, y, z) of the respective coordinate points are as follows.

E: (x, y, z)=(0.55, 0.20, 0.25)
F: (x, y, z)=(0.55, 0.43, 0.02)
G: (x, y, z)=(0.25, 0.73, 0.02)
H: (x, y, z)=(0.25, 0.50, 0.25)

Figure 1B:
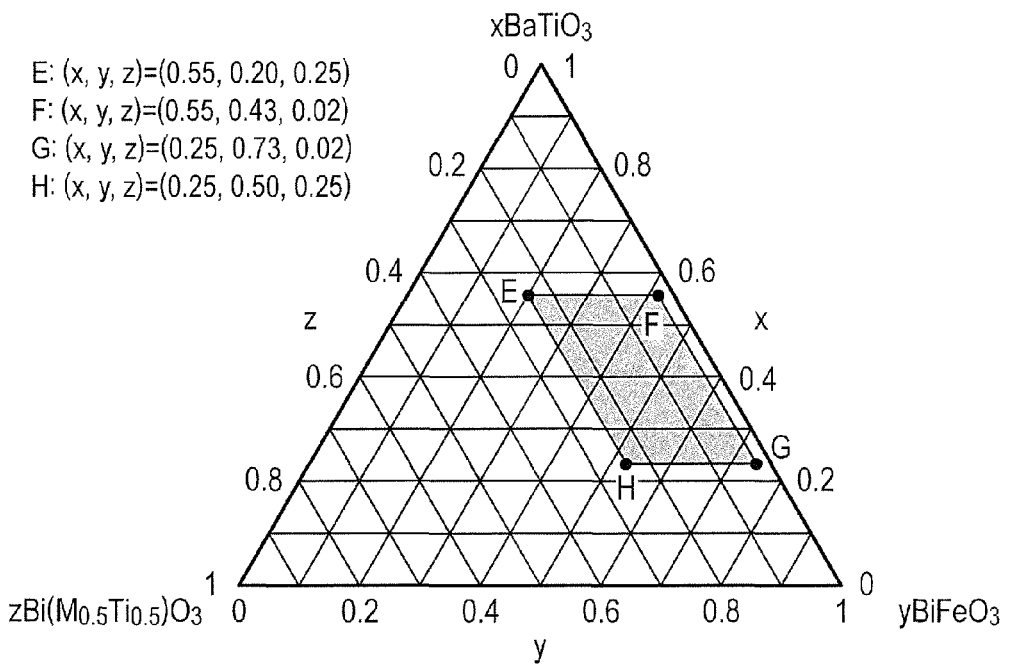
FIG. 1B is a phase diagram illustrating a piezoelectric material according to an embodiment of the present invention.

FIG. 1B is a triangle phase diagram illustrating more preferred compositional ranges of the piezoelectric material according to the present invention. The thick solid lines and regions surrounded by the lines indicate the compositional ranges of the present invention. The portion surrounded by the coordinate points E, F, G, H, and E indicates the compositional range of the metal oxide to be used in the piezoelectric material of the present invention, and excellent piezoelectric property is exhibited in the compositional range. The filled circles and solid lines are meant to fall within the compositional range. When V is incorporated in an amount of 0.0005 mol or more and 0.0050 mol or less with respect to 1 mol of the perovskite-type metal oxide represented by the general formula (1) satisfying the compositional range, a piezoelectric material which has a high Curie temperature and high insulation property and which exhibits higher piezoelectric performance can be obtained. A piezoelectric material, which is obtained by doping V satisfying the above-mentioned range into a perovskite-type metal oxide satisfying the above-mentioned compositional range, has a piezoelectric constant $d_{33}^*$ of 210 [pm/V] or more and has a Curie temperature of 200° C. or more. In addition, the piezoelectric material has such insulation property that the material can resist the application of a DC electric field of a 50 kV/cm or more for several minutes to several hours. An improvement in the insulation property also contributes to an improvement in piezoelectric performance because it allows a higher electric field to be applied to a piezoelectric material.

A raw material for V to be doped in the production of the piezoelectric material of the present invention is not particularly limited. The raw material may be a compound formed of pentavalent V (e.g., $V_2O_5$) or may be a compound formed of trivalent V (e.g., $V_2O_3$). Further, a vanadium metal or a vanadium salt (excluding an oxide) may be used. Further, a vanadium organic compound may be used.

In addition, positions of V contained in the piezoelectric material of the present invention are not limited particularly. V may be contained at the B site of the perovskite-type structure or may be contained as an oxide at a crystal grain boundary so that the same effect can be expected.

As to the piezoelectric material according to the present invention, it is preferred that the piezoelectric material be a ceramics, that an average equivalent circular diameter of a crystal grain forming the ceramics be 500 nm or more and 5 μm or less, and that a maximum equivalent circular diameter of the crystal grain be 5 μm or more and 10 μm or less.

The term "ceramics" used herein refers to an aggregate (also referred to as bulk) of crystal particles sintered by thermal treatment, or the so-called polycrystal, in which the main component thereof is a metal oxide. The term also includes one processed after sintering. However, the term does not include any powder or powder-dispersed slurry.

The "equivalent circular diameter" used herein refers to a "projected area equivalent circular diameter" that is generally mentioned in a microscopic observation method and indicates a diameter of a perfect circle having the same area as a projected area of the crystal grain. In the present invention, the method of measuring the equivalent circular diameter is not limited particularly. For example, the equivalent circular diameter can be determined by photographing a surface of the piezoelectric ceramics using a polarizing microscope or a scanning electron microscope, and by performing image processing on the obtained photographic image. An enlarging magnification when the equivalent circular diameter of the crystal grain is determined is, for example, about 5 to 5,000. An optical microscope and an electron microscope may be used selectively depending on the magnification. It is possible to determine the equivalent circular diameter not from an image of a surface of the ceramics but from an image of a polished surface or a cross-section.

The "average equivalent circular diameter" used herein refers to an average value of the equivalent circular diameter obtained by performing image processing on the photographic image obtained by photographing the piezoelectric ceramics. The average value may be a volume average or a number average, but the number average is preferred.

The "maximum equivalent circular diameter" used herein refers to a maximum value of the equivalent circular diameter obtained by performing image processing on the photographic image obtained by photographing the piezoelectric ceramics.

It is preferred that the average equivalent circular diameter of the crystal grain be 500 nm or more and 5 μm or less. When the average equivalent circular diameter is less than 500 nm, the density may be decreased so that sufficient piezoelectric property cannot be obtained. In addition, when the average equivalent circular diameter is more than 5 μm, mechanical strength may be deteriorated.

Further, it is preferred that the maximum equivalent circular diameter of the crystal grain be 5 μm or more and 10 μm or less. When the average equivalent circular diameter is less than 5 μm, the density may be decreased so that sufficient piezoelectric property cannot be obtained. In addition, when the average equivalent circular diameter is more than 10 μm, mechanical strength may be deteriorated.

In addition, a manufacturing method for the piezoelectric material of the present invention is not limited particularly.

When producing a ceramics, it is possible to adopt a general method of sintering solid powder of an oxide, a carbonate, a nitrate, an oxalate, and the like at a normal pressure. In addition, it is possible to use a method of cutting the sintered ceramics and overlaying the same to be adhered or a tape casting method of making ceramic powders in a sheet-like shape and overlaying the same so that a multilayered structure is achieved.

The raw material is made of a metal compound such as a barium (Ba) compound, a titanium (Ti) compound, a bismuth (Bi) compound, an iron (Fe) compound, a magnesium (Mg) compound, a nickel (Ni) compound, a zinc (Zn) compound, and a V compound.

Examples of the Ba compound which may be used include barium oxide, barium carbonate, barium oxalate, barium acetate, barium nitrate, and barium titanate.

Examples of the Ti compound which may be used include titanium oxide.

Examples of the Bi compound which may be used include bismuth oxide and bismuth nitrate.

Examples of the Fe compound which may be used include iron oxide, iron chloride, and iron nitrate.

Examples of the Mg compound which may be used include magnesium oxide, magnesium oxalate, magnesium chloride, and magnesium carbonate.

Examples of the Ni compound which may be used include nickel oxide, nickel nitrate, nickel chloride, and nickel oxalate.

Examples of the Zn compound which may be used include zinc oxide, zinc chloride, zinc nitrate, and zinc oxalate.

Examples of the V compound which may be used include vanadium oxide such as $V_2O_5$ and $V_2O_3$ and vanadium oxytrichloride.

In addition, the sintering method is not limited particularly. Examples of the sintering method include a sintering method using an electric furnace, an electric heating method, a microwave sintering method, a millimeter wave sintering method, and a hot isostatic pressing (HIP) method.

The sintering temperature is not limited but is desirably a temperature at which crystallites in the piezoelectric ceramics can form sufficiently. A preferred sintering temperature is 800° C. or more and 1,150° C. or less, more preferably 900° C. or more and 1,030° C. or less. The piezoelectric ceramics sintered at a temperature in the above-mentioned range exhibits a good piezoelectric property.

In order to stabilize the properties of the piezoelectric ceramics obtained by the sintering treatment, it is preferred to maintain the sintering temperature to be constant in the above-mentioned range to perform the sintering treatment for about an hour or more and 24 hours or less. A relative density of the sintered piezoelectric ceramics is preferably 90% or more, more preferably 95% or more. This is because, when the relative density is less than 90%, a relative dielectric constant of the piezoelectric ceramics is conspicuously decreased, and the mechanical strength is also decreased. Examples of means for increasing the relative density include a method of doping manganese or copper and a method of using the tape casting method to make a compact.

In the following, a piezoelectric element using the piezoelectric material of the present invention is described.

Figure 2:
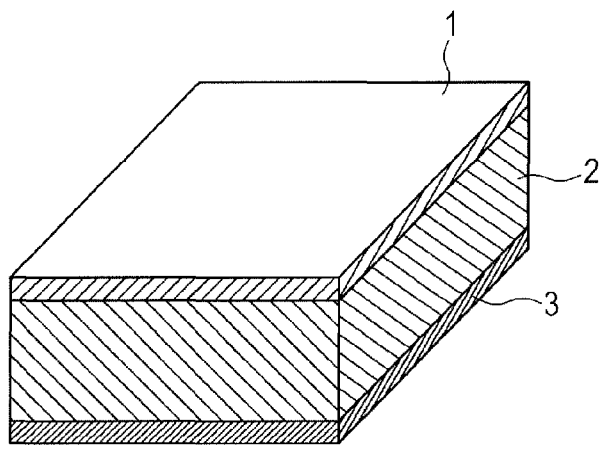
FIG. 2 is a schematic diagram illustrating a configuration of a piezoelectric element according to an embodiment of the present invention.

FIG. 2 is a schematic diagram illustrating a configuration of a piezoelectric element according to an embodiment of the present invention. The piezoelectric element according to the present invention is a piezoelectric element including at least a first electrode 1, a piezoelectric material portion 2, and a second electrode 3, and a piezoelectric material forming the piezoelectric material portion 2 is the piezoelectric material of the present invention.

The piezoelectric property of the piezoelectric material of the present invention can be evaluated by forming the piezoelectric element including at least the first electrode and the second electrode. The first electrode and the second electrode are each formed of a conductive layer having a thickness of about 5 nm to 2,000 nm. A material therefor is not particularly limited and has only to be one to be generally used for a piezoelectric element. Examples thereof may include metals such as Ti, Pt, Ta, Ir, Sr, In, Sn, Au, Al, Fe, Cr, Ni, Pd, Ag, and Cu, and compounds thereof.

Each of the first electrode and the second electrode may be formed of one kind of those materials, or may be obtained by stacking two or more kinds thereof. The first electrode and the second electrode may be formed of different materials, respectively.

A manufacturing method for the first electrode and the second electrode is not limited. The first electrode and the second electrode may be formed by baking a metal paste or by sputtering, vapor deposition, or the like. In addition, both the first electrode and the second electrode may be patterned in desired shapes for use.

It is more preferred that the piezoelectric element have spontaneous polarization axes aligned in a certain direction. When the spontaneous polarization axes are aligned in a certain direction, the piezoelectric constant of the piezoelectric element increases.

A polarization method for the piezoelectric element is not particularly limited. The polarization treatment may be performed in the air or may be performed in an oil. A temperature at which the polarization is performed is preferably a temperature of 60° C. to 160° C. However, an optimum condition slightly varies depending on the composition of a piezoelectric material constituting the element. An electric field to be applied for performing the polarization treatment is preferably equal to or higher than the coercive field of the material, and is specifically 1 to 5 kV/mm.

The piezoelectric constant and electromechanical quality factor of the piezoelectric element may be determined by calculation, from the measurement results of a resonance frequency and an antiresonance frequency, which are obtained with a commercially available impedance analyzer, based on the standard of Japan Electronics and Information Technology Industries Association (JEITA EM-4501). This method is hereinafter referred to as resonance-antiresonance method.

Next, a multilayered piezoelectric element using the piezoelectric material of the present invention is described.

The multilayered piezoelectric element according to the present invention is a multilayered piezoelectric element including piezoelectric material layers and electrodes including an internal electrode stacked alternately, in which the piezoelectric material layers are formed of the piezoelectric material of the present invention.

Figure 3A:
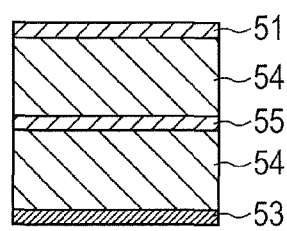
FIG. 3A is a schematic sectional diagram illustrating a configuration of a multilayered piezoelectric element according to an embodiment of the present invention.
Figure 3B:
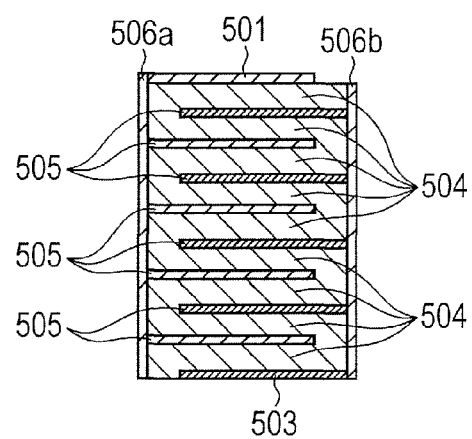
FIG. 3B is a schematic sectional diagram illustrating a configuration of a multilayered piezoelectric element according to an embodiment of the present invention.

FIGS. 3A and 3B are each a schematic sectional diagram illustrating a configuration of a multilayered piezoelectric element according to an embodiment of the present invention. The multilayered piezoelectric element according to the present invention is a multilayered piezoelectric element including piezoelectric material layers 54 and electrodes including an internal electrode 55, the piezoelectric material layers and the layered electrodes being stacked alternately, in which the piezoelectric material layers 54 are formed of the above-mentioned piezoelectric material. The electrodes may include external electrodes such as a first electrode 51 and a second electrode 53 in addition to the internal electrode 55.

FIG. 3A illustrates the configuration of the multilayered piezoelectric element of the present invention in which the piezoelectric material layers 54 of two layers and the internal electrode 55 of one layer are stacked alternately, and the multilayered structure is sandwiched between the first electrode 51 and the second electrode 53. However, as illustrated in FIG. 3B, the number of piezoelectric material layers and internal electrodes may be increased, and the number of the layers is not limited. The multilayered piezoelectric element of FIG. 3B has such a configuration that piezoelectric material layers 504 of nine layers and internal electrodes 505 of eight layers are stacked alternately, and the multilayered structure is sandwiched between a first electrode 501 and a second electrode 503, and has an external electrode 506a and an external electrode 506b for short-circuiting the alternately formed internal electrodes.

The internal electrodes 55, 505 and the external electrodes 506a, 506 b do not need to be identical in size and shape to the piezoelectric material layers 54, 504, and may be divided into multiple portions.

The internal electrodes 55, 505 and the external electrodes 506a, 506 b are formed of a conductive layer having a thickness of about 5 nm to 2,000 nm. A material therefor is not particularly limited and has only to be one to be generally used for a piezoelectric element. Examples thereof may include metals such as Ti, Pt, Ta, Ir, Sr, In, Sn, Au, Al, Fe, Cr, Ni, Pd, Ag, and Cu and compounds thereof. The internal electrodes 55, 505 and the external electrodes 506a, 506 b may be formed of one kind thereof, may be formed of a mixture or alloy of two or more kinds thereof, or may be formed of a multilayered body of two or more kinds thereof. Further, multiple electrodes may be respectively formed of materials different from each other. From the viewpoint that an electrode material is inexpensive, it is preferred that the internal electrodes 55, 505 contain at least any one kind of Ni and Cu. When at least any one kind of Ni and Cu is used for the internal electrodes 55, 505, the multilayered piezoelectric element of the present invention is preferably fired in a reducing atmosphere.

In the multilayered piezoelectric element of the present invention, the internal electrode contains Ag and Pd, and a weight ratio M1/M2 between the content weight M1 of Ag and the content weight M2 of Pd is preferably $1.51 \leq M1/M2 \leq 9.0$, more preferably $2.31 \leq M1/M2 \leq 4.0$. A case where the weight ratio M1/M2 is less than 1.5 is not desired because the sintering temperature of the internal electrode increases. On the other hand, a case where the weight ratio M1/M2 is more than 9.0 is not desired because the internal electrode becomes island-shaped, resulting in in-plane non-uniformity.

As illustrated in FIG. 3B, multiple electrodes including the internal electrodes 505 may be short-circuited to each other for the purpose of making the phase of a driving voltage uniform. For example, there is a given such a configuration that the internal electrodes 505, the first electrode 501, and the second electrode 503 are short-circuited alternately. Further, a mode in which the electrodes are short-circuited to each other is not limited. An electrode or wiring for short-circuit may be provided on a side surface of the multilayered piezoelectric element. Alternatively, the electrodes may be short-circuited to each other by providing a through-hole passing through the piezoelectric material layers 504 and providing a conductive material inside the through hole.

Next, a manufacturing method for the multilayered piezoelectric element using the piezoelectric material of the present invention is described.

A manufacturing method for a multilayered piezoelectric element according to the present invention includes: a step (A) of dispersing metal compound powder containing at least Na, Ba, Li, Nb, Ti, and Cu to prepare a slurry; a step (B) of obtaining a compact from the slurry; a step (C) of forming an electrode on the compact; and a step (D) of sintering a compact in which the compact containing the metal compound powder and the electrode are stacked alternately to yield a multilayered piezoelectric element, in which the temperature of the sintering in the step (D) is 1,200° C. or less. The metal oxide powder may contain copper. The powder as used herein is intended to mean an aggregate of solid particles. The aggregate may be an aggregate of particles containing Ba, Na, Li, Ti, Nb, and Cu simultaneously, or may be an aggregate of multiple kinds of particles containing any element.

Examples of the metal compound powder in the step (A) may include powders of a Ba compound, a Na compound, a Li compound, a Ti compound, a Nb compound, and a Cu compound.

Examples of the Na compound which may be used include sodium carbonate and sodium niobate.

Examples of the Ba compound which may be used include an oxide, a carbonate, an oxalate, an acetate, a nitrate, and a titanate of Ba.

Examples of the Li compound which may be used include lithium carbonate and lithium niobate.

Examples of the Ti compound which may be used include titanium oxide and barium titanate.

Examples of the Nb compound which may be used include niobium oxide and sodium niobate. Examples of the Cu compound which may be used include copper(I) oxide, copper(II) oxide, copper carbonate, copper(II) acetate, and copper oxalate.

A preparation method for the slurry in the step (A) is exemplified. A solvent is added in a weight of 1.6 to 1.7-fold with respect to the metal compound powder, followed by mixing. As the solvent, for example, toluene, ethanol, a mixed solvent of toluene and ethanol, n-butyl acetate, or water may be used. The components are mixed in a ball mill for 24 hours. After that, a binder and a plasticizer are added. Examples of the binder include polyvinyl alcohol (PVA), polyvinyl butyral (PVB), and an acrylic resin. When PVB is used as the binder, the solvent and PVB are weighed so that a weight ratio therebetween is, for example, 88:12. Examples of the plasticizer include dioctyl sebacate, dioctyl phthalate, and dibutyl phthalate. When dibutyl phthalate is used as the plasticizer, equal weights of dibutyl phthalate and the binder are weighed. Then, the mixing in a ball mill is performed again overnight. The amounts of the solvent and the binder are adjusted so that the viscosity of the slurry is 300 to 500 mPa·s.

The compact in the step (B) is a sheet-shaped mixture of the metal compound powder, the binder, and the plasticizer. As a method of obtaining the compact in the step (B), for example, there is given sheet forming. For example, a doctor blade method may be employed for the sheet forming. The doctor blade method is a method of forming a sheet-shaped compact involving applying the slurry onto the base material with a doctor blade and drying the applied slurry. As the base material, for example, a PET film may be used. It is desired that the surface of the PET film onto which the slurry is applied be coated with fluorine because the coating facilitates the peeling of the compact. The drying may be natural drying or hot-air drying. The thickness of the compact is not particularly limited and may be adjusted depending on the thickness of the multilayered piezoelectric element. The thickness of the compact may be increased by, for example, increasing the viscosity of the slurry.

Manufacturing methods for the electrodes, that is, the internal electrodes 505 and the external electrodes 506a, 506 b in the step (C) are not limited. The electrodes may be formed by baking a metal paste, or may be formed by, for example, sputtering, a vapor deposition, or a printing method. For the purpose of reducing a driving voltage, the thickness and pitch interval of the piezoelectric material layers 504 are reduced in some cases. In that case, there is selected a process involving forming a multilayered body including a precursor for the piezoelectric material layers 504 and the internal electrodes 505 and then firing the multilayered body simultaneously. In that case, there is demanded an internal electrode material which does not undergoes deformation and conductivity deterioration at a temperature required for sintering the piezoelectric material layers 504. An inexpensive metal having a low melting point as compared to Pt, such as Ag, Pd, Au, Cu, or Ni, or an alloy thereof may be used for the internal electrodes 505 and the external electrodes 506a, 506 b. In this connection, the external electrodes 506a, 506 b may be provided after the firing of the multilayered body. In that case, Al or a carbon-based electrode material may be used in addition to Ag, Pd, Cu, or Ni.

A method of forming the electrode is desirably a screen printing method. The screen printing method is a method involving providing a screen printing plate on a compact provided on a base material and applying a metal paste with a spatula from above the screen printing plate. A screen mesh is formed on at least part of the screen printing plate. Thus, the metal paste at a portion on which the screen mesh is formed is applied onto the compact. The screen mesh in the screen printing plate desirably has a pattern formed therein. An electrode can be patterned onto the compact by transferring the pattern onto the compact through use of the metal paste.

The electrode is formed in the step (C) and then peeled from the base material. After that, one or multiple sheets of the compact are stacked and subjected to compression bonding. As a method for the compression bonding, there are given uniaxial pressing, cold isostatic pressing, and hot isostatic pressing. The hot isostatic pressing is desired because a pressure can be applied isotropically and uniformly. It is desired to heat the compact to around the glass transition temperature of the binder during the compression bonding because more satisfactory compression bonding can be achieved. Multiple sheets of the compact can be stacked and subjected to compression bonding so as to achieve a desired thickness. For example, 10 to 100 sheets of the compact can be stacked and then subjected to thermocompression bonding involving applying a pressure of 10 to 60 MPa in a stacking direction over 10 seconds to 10 minutes at 50 to 80° C., to thereby stack the sheets of the compact. Further, multiple sheets of the compact may be aligned and stacked with good accuracy by putting alignment marks on electrodes. It should be appreciated that multiple sheets of the compact may also be stacked with good accuracy by providing a through-hole for positioning in the compact.

In the step (D), it is suitable that the temperature of the sintering be 1,200° C. or less because a metal having a low melting point and low cost as compared to Pt, such as Ag, Pd, Au, Cu, or Ni, or an alloy thereof may be used. When Ni or Cu is used for the electrode, the sintering in the step (D) is preferably performed in a reducing atmosphere.

In the manufacturing method for a multilayered piezoelectric element according to the present invention, it is preferred that the slurry contain at least a perovskite-type metal oxide containing Ba, Na, Li, Ti, Nb, and Cu. Examples of the perovskite-type metal oxide include sodium niobate and barium titanate. The slurry may contain Cu. In that case, copper(I) oxide or copper(II) oxide may be used.

It is suitable that the slurry contain copper oxide because grain growth is promoted during the sintering, resulting in an increase in density of the sintered body.

Figure 4A:
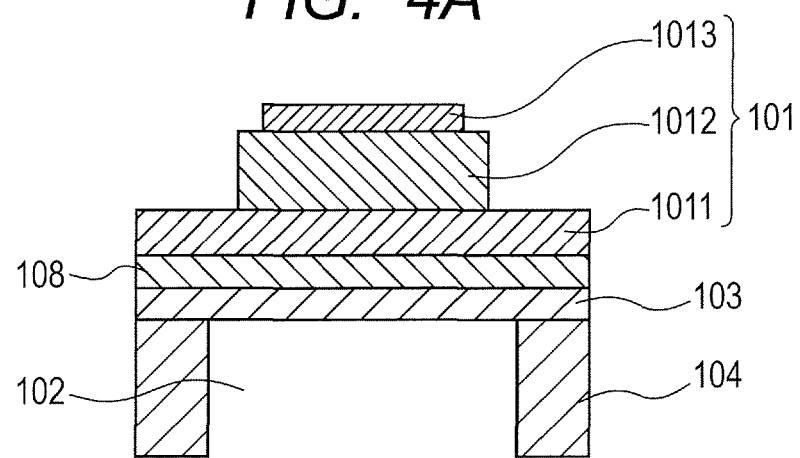
FIG. 4A is a schematic diagram illustrating a configuration of a liquid discharge head according to an embodiment of the present invention.
Figure 4B:
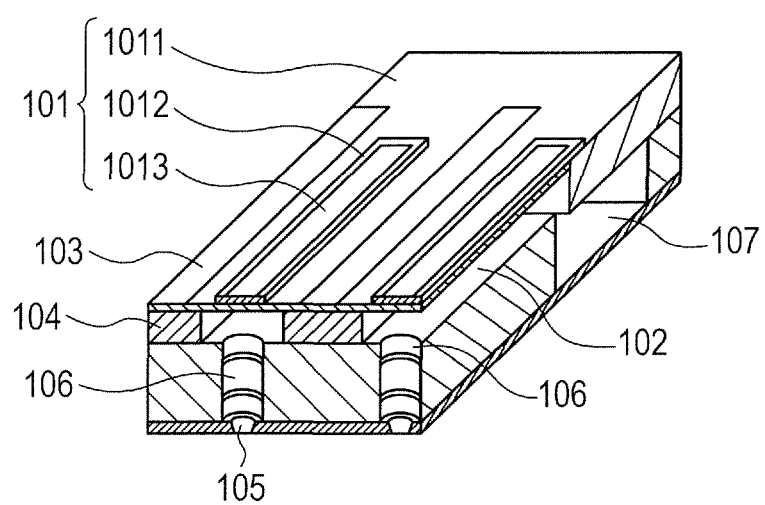
FIG. 4B is a schematic diagram illustrating a configuration of a liquid discharge head according to an embodiment of the present invention.

FIGS. 4A and 4B are schematic diagrams illustrating a configuration of a liquid discharge head according to an embodiment of the present invention. As illustrated in FIGS. 4A and 4B, the liquid discharge head of the present invention is a liquid discharge head including a piezoelectric element 101 of the present invention. The piezoelectric element 101 is a piezoelectric element including at least a first electrode 1011, a piezoelectric material 1012, and a second electrode 1013. The piezoelectric material 1012 is patterned as required as illustrated in FIG. 4B.

FIG. 4B is a schematic diagram of the liquid discharge head. The liquid discharge head includes ejection ports 105, individual liquid chambers 102, communicating holes 106 for connecting the individual liquid chambers 102 and the ejection ports 105, liquid chamber partition walls 104, a common liquid chamber 107, a diaphragm 103, and the piezoelectric elements 101. Each of the piezoelectric elements 101, which is of a rectangular shape in FIG. 4B, may be of a shape besides the rectangular shape such as an elliptical shape, a circular shape, or a parallelogram shape. In general, the piezoelectric materials 1012 are each of a shape in conformity with the shape of the individual liquid chamber 102.

The vicinity of the piezoelectric element 101 included in the liquid discharge head of the present invention is described in detail with reference to FIG. 4A. FIG. 4A is a sectional diagram of the piezoelectric element in the width direction of the liquid discharge head illustrated in FIG. 4B. The sectional shape of the piezoelectric element 101, which is illustrated in a rectangular shape, may be a trapezoidal shape or a reverse trapezoidal shape. In FIG. 4A, the first electrode 1011 is used as the lower electrode, and the second electrode 1013 is used as the upper electrode. However, the arrangement of the first electrode 1011 and the second electrode 1013 is not limited to the foregoing. For example, the first electrode 1011 may be used as the lower electrode, or may be used as the upper electrode. Similarly, the second electrode 1013 may be used as the upper electrode, or may be used as the lower electrode. In addition, a buffer layer 108 may be present between the diaphragm 103 and the lower electrode.

Note that, those differences in name are caused by a manufacturing method for the device and an advantageous effect of the present invention can be obtained in any case.

In the liquid discharge head, the diaphragm 103 vertically fluctuates owing to the expansion and contraction of the piezoelectric material 1012 to become a vibrating unit. This vibrating unit applies a pressure to liquid in the individual liquid chamber 102. As a result, the liquid is discharged from the ejection port 105. The liquid discharge head of the present invention can be used in a printer application or the manufacture of an electronic apparatus.

The diaphragm 103 has a thickness of 1.0 µm or more to 15 µm or less, preferably 1.5 µm or more to 8 µm or less. A material for the diaphragm, which is not limited, is preferably Si. Si for the diaphragm may be doped with B or P. In addition, the buffer layer and the electrode layer on the diaphragm may serve as part of the diaphragm.

The buffer layer 108 has a thickness of 5 nm or more to 300 nm or less, preferably 10 nm or more to 200 nm or less.

The size of the ejection port 105 is 5 µm or more to 40 µm or less in terms of an equivalent circular diameter. The shape of the ejection port 105 may be a circular shape, or may be a star shape, a square shape, or a triangular shape.

Next, a liquid discharge device of the present invention is described. The liquid discharge device of the present invention includes a conveying portion for a recording medium and the liquid discharge head.

Figure 5:
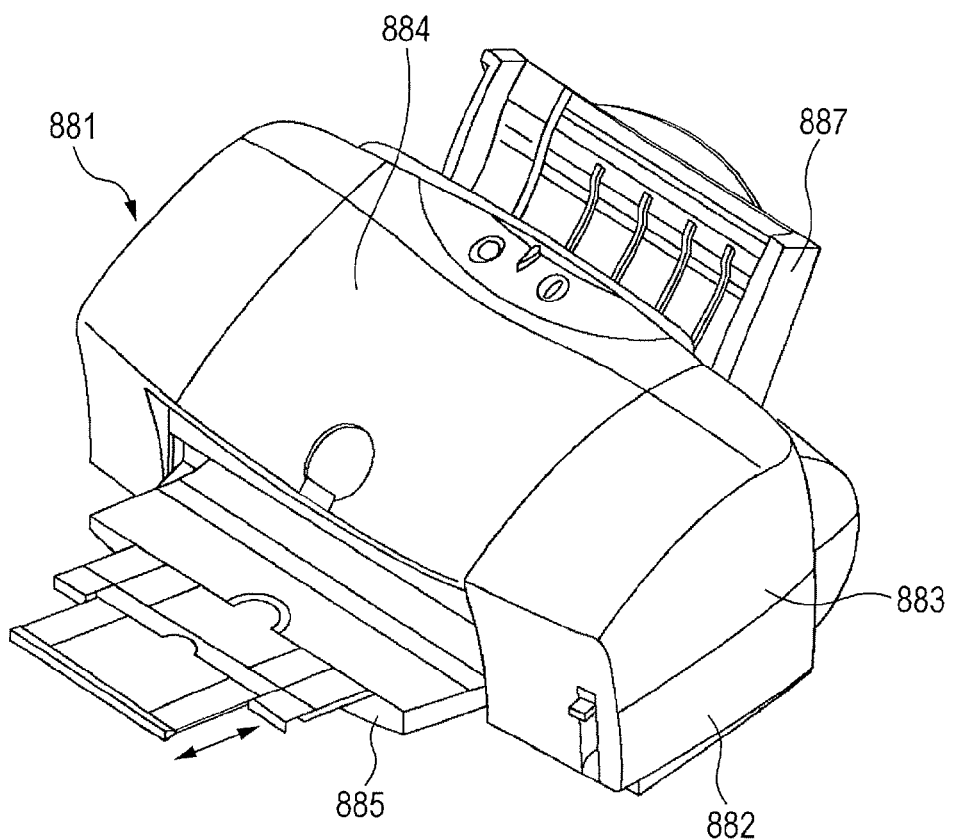
FIG. 5 is a schematic diagram illustrating a liquid discharge device according to an embodiment of the present invention.
Figure 6:
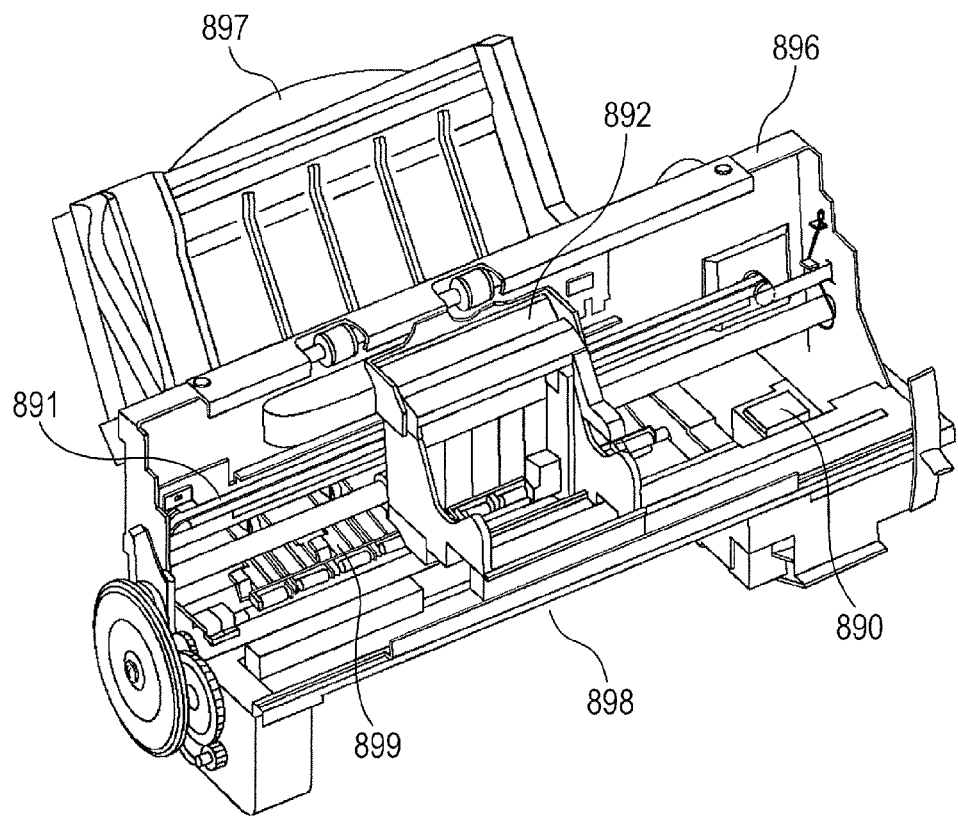
FIG. 6 is a schematic diagram illustrating the liquid discharge device according to the embodiment of the present invention.

As an example of the liquid discharge device of the present invention, there is an ink-jet recording apparatus illustrated in FIGS. 5 and 6. FIG. 6 illustrates a liquid discharge device (ink-jet recording apparatus) 881 illustrated in FIG. 5 in a state in which sheathings 882 to 885 and 887 thereof are removed. The ink-jet recording apparatus 881 includes an automatic feeder 897 for automatically feeding recording sheets as recording media into a device main body 896. Further, the ink-jet recording apparatus 881 includes a conveying portion 899 for guiding the recording sheet fed from the automatic feeder 897 to a predetermined recording position and from the recording position to a discharge port 898, a recording unit 891 for performing recording on the recording sheet conveyed to the recording position, and a recovery unit 890 for performing a recovery process on the recording unit 891. The recording unit 891 includes a carriage 892 which contains the liquid discharge head of the present invention and is reciprocated on a rail.

In this ink-jet recording apparatus, the carriage 892 is moved on the rail based on an electric signal sent from a computer, and a drive voltage is applied to electrodes sandwiching a piezoelectric material so that the piezoelectric material is displaced. This displacement of the piezoelectric material pressurizes each individual liquid chamber 102 via the diaphragm 103 illustrated in FIG. 4B, and hence ink is discharged from the ejection port 105 so as to perform printing. The liquid discharge device of the present invention can discharge liquid uniformly at high speed, and hence the device can be downsized.

In the example described above, the printer is exemplified. However, the liquid discharge device of the present invention can be used as a printing device such as an ink-jet recording apparatus including a facsimile, a multifunction peripheral, a copying machine, and the like, or as an industrial liquid discharge device or a drawing apparatus for an object.

Next, an ultrasonic motor using the piezoelectric element of the present invention is described.

Figure 7A:
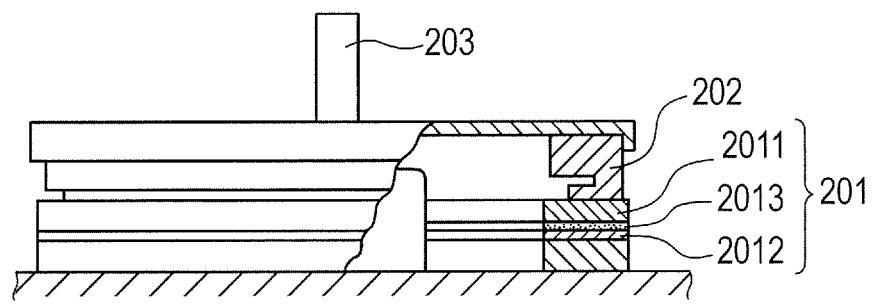
FIG. 7A is a schematic diagram illustrating a configuration of an ultrasonic motor according to an embodiment of the present invention.
Figure 7B:
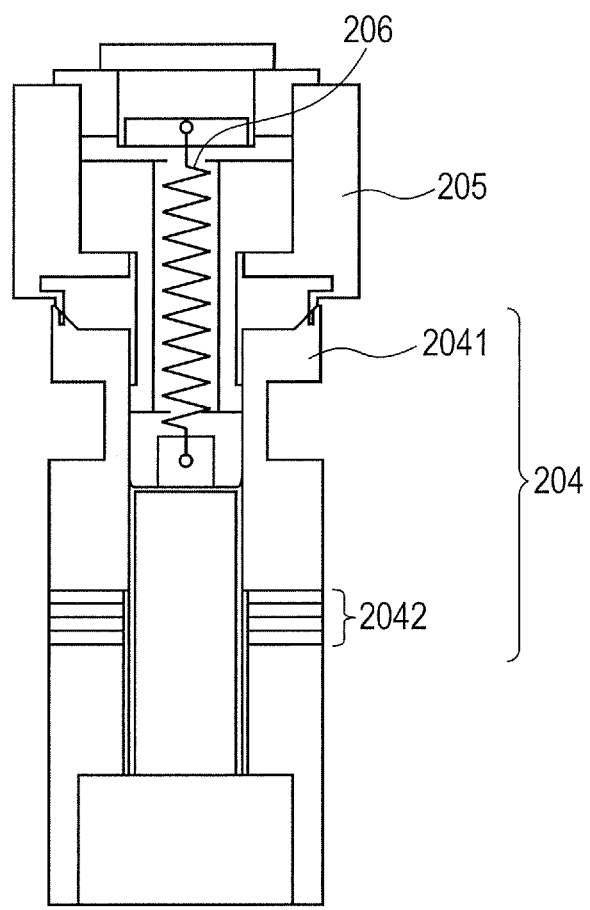
FIG. 7B is a schematic diagram illustrating a configuration of an ultrasonic motor according to an embodiment of the present invention.

FIGS. 7A and 7B are schematic diagrams illustrating a configuration of an ultrasonic motor according to an embodiment of the present invention.

FIG. 7A illustrates the ultrasonic motor in which the piezoelectric element of the present invention is formed of a single plate. The ultrasonic motor includes an oscillator 201 as a vibrating member, a rotor 202 as a rotor, which is brought into contact with the sliding surface of the oscillator 201 with a pressure applied from a pressurizing spring (not shown), and an output shaft 203 provided so as to be integral with the rotor 202. The oscillator 201 is formed of a metal elastic ring 2011, a piezoelectric element 2012 of the present invention, and an organic adhesive 2013 for bonding the piezoelectric element 2012 to the elastic ring 2011 (such as an epoxy- or cyanoacrylate-based adhesive). The piezoelectric element 2012 of the present invention is formed of a piezoelectric material sandwiched between a first electrode (not shown) and a second electrode (not shown).

The application of two alternating voltages different from each other in phase by $\pi/2$ to the piezoelectric element of the present invention results in the generation of a flexural traveling wave in the oscillator 201, and hence each point on the sliding surface of the oscillator 201 undergoes an elliptical motion. When the rotor 202 is brought into press contact with the sliding surface of the oscillator 201, the rotor 202 receives a frictional force from the oscillator 201 to rotate in the direction opposite to the flexural traveling wave. A body to be driven (not shown) is joined to the output shaft 203, and is driven by the rotary force of the rotor 202.

The application of a voltage to the piezoelectric material results in the expansion and contraction of the piezoelectric material due to a transverse piezoelectric effect. When an elastic body such as a metal is joined to the piezoelectric element, the elastic body is bent by the expansion and contraction of the piezoelectric material. The ultrasonic motor of the kind described here utilizes this principle.

Next, an ultrasonic motor including a piezoelectric element having a multilayered structure is illustrated in FIG. 7B. An oscillator 204 is formed of a multilayered piezoelectric element 2042 sandwiched between tubular metal elastic bodies 2041. The multilayered piezoelectric element 2042 is an element formed of multiple stacked piezoelectric materials (not shown), and includes a first electrode and a second electrode on its outer surfaces of the stack, and internal electrodes on its inner surface of the stack. The metal elastic bodies 2041 are fastened with bolts so that the piezoelectric element 2042 may be sandwiched between and fixed by the bodies. Thus, the oscillator 204 is formed.

The application of alternating voltages different from each other in phase to the piezoelectric element 2042 causes the oscillator 204 to excite two vibrations orthogonal to each other. The two vibrations are synthesized to form a circular vibration for driving the tip portion of the oscillator 204. Note that, a constricted annular groove is formed in the upper portion of the oscillator 204 to enlarge the displacement of the vibration for driving.

A rotor 205 is brought into contact with the oscillator 204 under a pressure from a spring 206 for pressurization to obtain a frictional force for driving. The rotor 205 is rotatably supported by a bearing.

Next, an optical apparatus of the present invention is described. The optical apparatus of the present invention includes a drive unit including the ultrasonic motor.

Figure 8A:
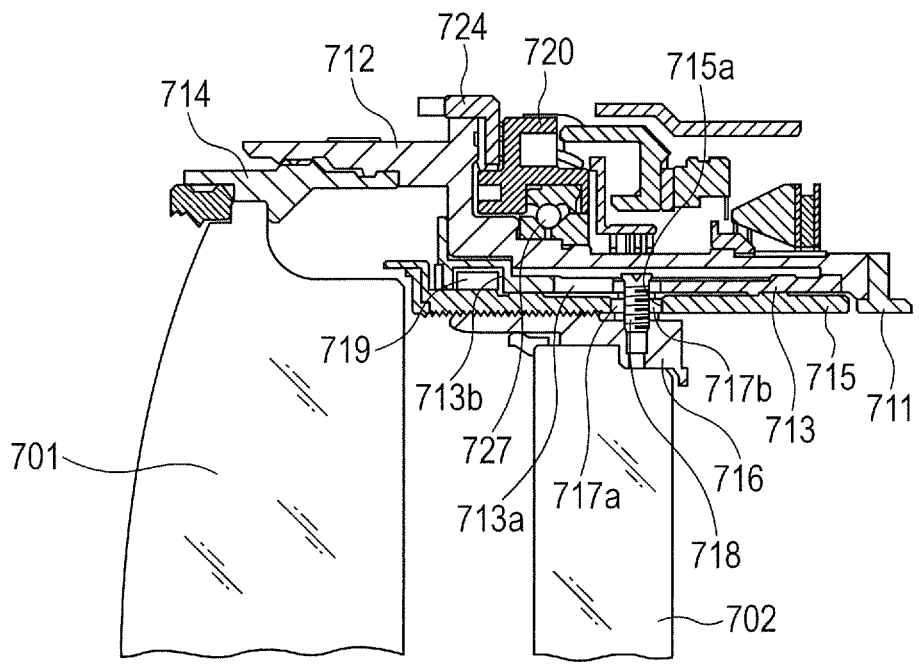
FIG. 8A is a schematic diagram illustrating an optical apparatus according to an embodiment of the present invention.
Figure 8B:
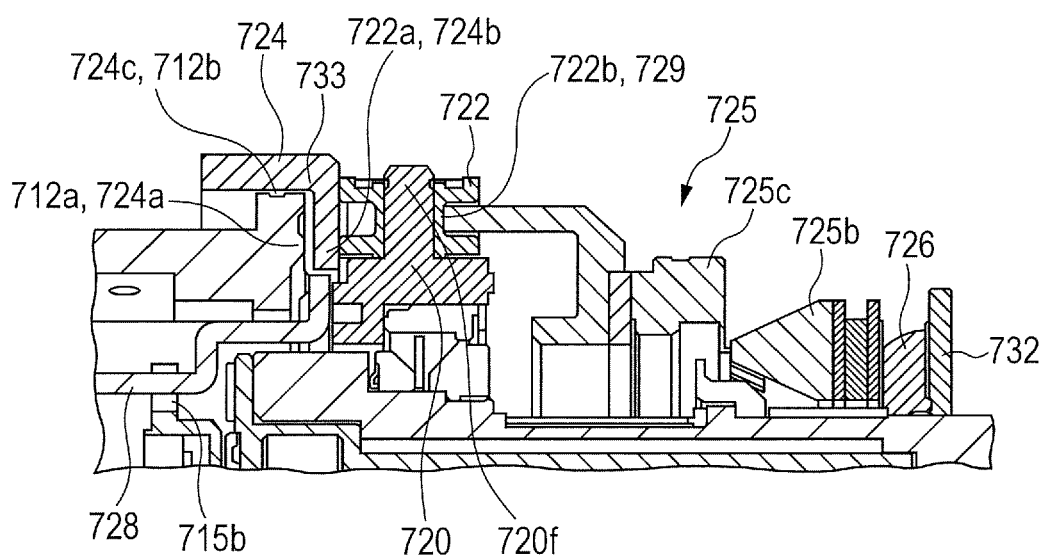
FIG. 8B is a schematic diagram illustrating an optical apparatus according to an embodiment of the present invention.
Figure 9:
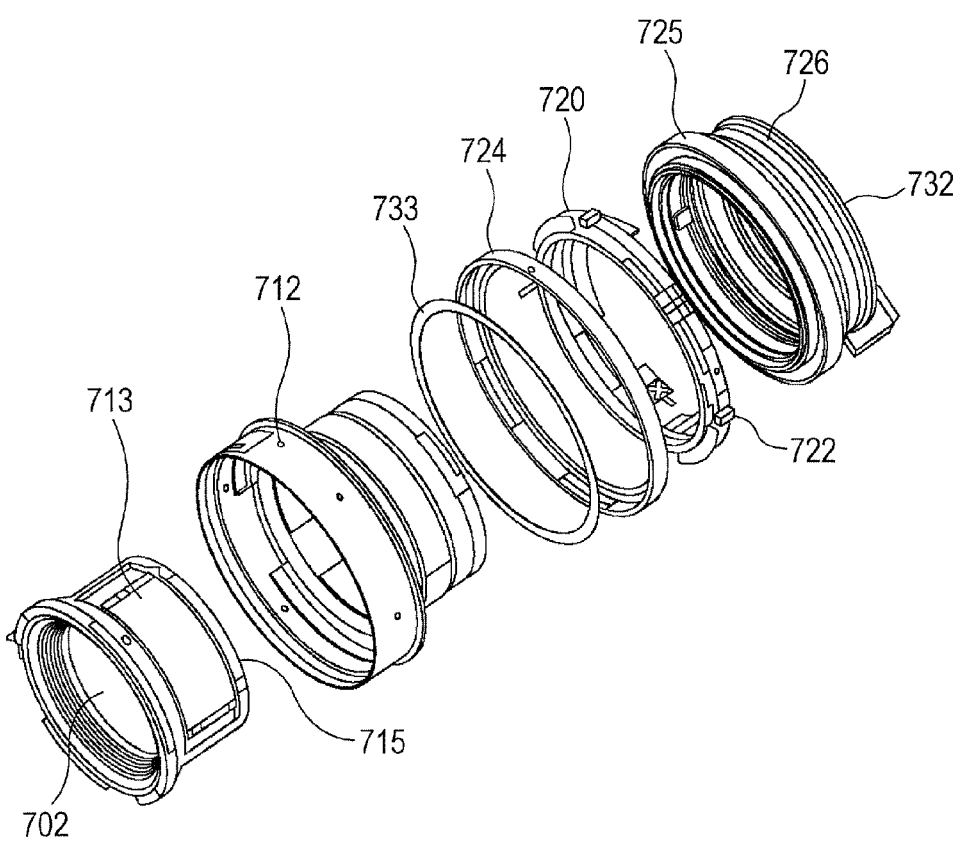
FIG. 9 is a schematic diagram illustrating the optical apparatus according to the embodiment of the present invention.

FIGS. 8A and 8B are sectional diagrams of main parts of an interchangeable lens barrel for a single lens reflex camera as an example of an image pickup device according to an exemplary embodiment of the present invention. In addition, FIG. 9 is an exploded perspective diagram of the interchangeable lens barrel for the single lens reflex camera as the example of the image pickup device according to the exemplary embodiment of the present invention. A fixed barrel 712, a linear guide barrel 713, and a front unit barrel 714 are fixed to a quick-detaching mount 711 for a camera. These are fixed members of the interchangeable lens barrel.

A linear guide groove 713a in an optical axis direction for a focus lens 702 is formed on the linear guide barrel 713. Cam rollers 717a and 717b protruding outward in a radial direction are fixed to a rear unit barrel 716 supporting the focus lens 702 via axial screws 718, and the cam roller 717a is fitted in the linear guide groove 713a.

A cam ring 715 is fitted on the inner periphery of the linear guide barrel 713 in a rotatable manner. Relative movement between the linear guide barrel 713 and the cam ring 715 in the optical axis direction is restricted because a roller 719 fixed to the cam ring 715 is fitted in an annular groove 713b of the linear guide barrel 713. A cam groove 715a for the focus lens 702 is formed on the cam ring 715, and the above-mentioned cam roller 717b is simultaneously fitted in the cam groove 715a.

On the outer peripheral side of the fixed barrel 712, there is disposed a rotation transmission ring 720 supported by a ball race 727 in a rotatable manner at a constant position with respect to the fixed barrel 712. The rotation transmission ring 720 has shafts 720f extending radially from the rotation transmission ring 720, and rollers 722 are supported by the shafts 720f in a rotatable manner. A large diameter part 722a of the roller 722 contacts with a mount side end surface 724b of a manual focus ring 724. In addition, a small diameter part 722b of the roller 722 contacts with a joining member 729. Six rollers 722 are disposed on the outer periphery of the rotation transmission ring 720 at uniform intervals, and each roller is provided in the relationship as described above.

A low friction sheet (washer member) 733 is disposed on an inner diameter part of the manual focus ring 724, and this low friction sheet is sandwiched between a mount side end surface 712a of the fixed barrel 712 and a front side end surface 724a of the manual focus ring 724. In addition, an outer diameter surface of the low friction sheet 733 is formed in a ring shape so as to be circumferentially fitted on an inner diameter part 724c of the manual focus ring 724. Further, the inner diameter part 724c of the manual focus ring 724 is circumferentially fitted on an outer diameter part 712b of the fixed barrel 712. The low friction sheet 733 has a role of reducing friction in a rotation ring mechanism in which the manual focus ring 724 rotates relatively to the fixed barrel 712 about the optical axis.

Note that, the large diameter part 722a of the roller 722 contacts with the mount side end surface 724a of the manual focus ring in a state in which a pressure is applied by a pressing force of a wave washer 726 pressing an ultrasonic motor 725 to the front of the lens. In addition, similarly, the small diameter part 722b of the roller 722 contacts with the joining member 729 in a state in which an appropriate pressure is applied by a pressing force of the wave washer 726 pressing the ultrasonic motor 725 to the front of the lens. Movement of the wave washer 726 in the mount direction is restricted by a washer 732 connected to the fixed barrel 712 by bayonet joint. A spring force (biasing force) generated by the wave washer 726 is transmitted to the ultrasonic motor 725, and further to the roller 722, to be a force for the manual focus ring 724 to press the mount side end surface 712*a* of the fixed barrel 712. In other words, the manual focus ring 724 is integrated in a state in which the manual focus ring 724 is pressed to the mount side end surface 712*a* of the fixed barrel 712 via the low friction sheet 733.

Therefore, when a control unit (not shown) drives the ultrasonic motor 725 to rotate with respect to the fixed barrel 712, the rollers 722 rotate about the shafts 720*f* because the joining member 729 is brought into contact by friction to the small diameter parts 722*b* of the rollers 722. As a result of the rotation of the rollers 722 about the shafts 720*f*, the rotation transmission ring 720 rotates about the optical axis (automatic focus operation).

In addition, when a manual operation input portion (not shown) gives a rotation force about the optical axis to the manual focus ring 724, the rollers 722 rotate about the shafts 720*f* by friction force because the mount side end surface 724*b* of the manual focus ring 724 is brought into contact by pressure to the large diameter parts 722*a* of the rollers 722. When the large diameter parts 722*a* of the rollers 722 rotate about the shafts 720*f*, the rotation transmission ring 720 rotates about the optical axis. In this case, the ultrasonic motor 725 does not rotate because of a friction retaining force between a rotor 725*c* and a stator 725*b* (manual focus operation).

Two focus keys 728 are mounted to the rotation transmission ring 720 at opposing positions, and the focus key 728 is fitted to a notch portion 715*b* disposed on the tip of the cam ring 715. Therefore, when the automatic focus operation or the manual focus operation is performed so that the rotation transmission ring 720 is rotated about the optical axis, the rotation force is transmitted to the cam ring 715 via the focus key 728. When the cam ring is rotated about the optical axis, the rear unit barrel 716 whose rotation is restricted by the cam roller 717*a* and the linear guide groove 713*a* is moved forward and backward along the cam groove 715*a* of the cam ring 715 by the cam roller 717*b*. Thus, the focus lens 702 is driven, and the focus operation is performed.

In this case, the interchangeable lens barrel for the single lens reflex camera is described above as the optical apparatus of the present invention, but the present invention can be applied to any optical apparatus including the ultrasonic motor in the drive unit, regardless of a type of the camera, including a compact camera, an electronic still camera, a personal digital assistant with camera, and the like.

A vibratory device used for conveying or removing particles, powder, or liquid droplets is used widely for an electronic apparatus or the like.

Next, as an example of the vibratory device of the present invention, a dust removing device using the piezoelectric element of the present invention is described.

Figure 10A:
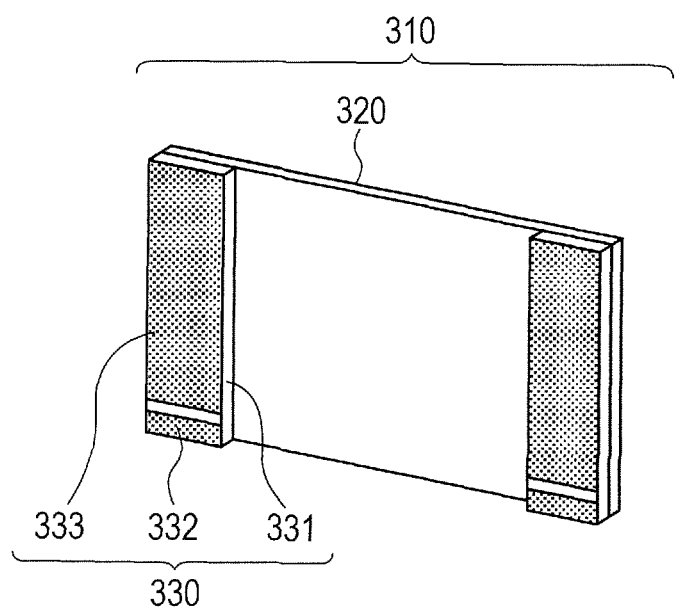
FIG. 10A is a schematic diagram illustrating a dust removing device according to an embodiment of the present invention.
Figure 10B:
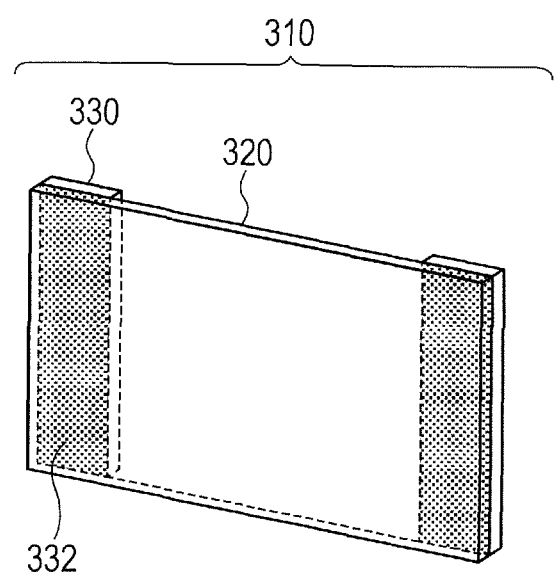
FIG. 10B is a schematic diagram illustrating a dust removing device according to an embodiment of the present invention.

FIGS. 10A and 10B are schematic diagrams illustrating a dust removing device according to an embodiment of the present invention. A dust removing device 310 is formed of a vibrating member including a plate-like piezoelectric element 330 and a diaphragm 320. The material of the diaphragm 320 is not limited. In the case where the dust removing device 310 is used for an optical apparatus, a transparent material or a reflective material can be used as the material of the diaphragm 320.

Figures 11A, 11B, 11C:
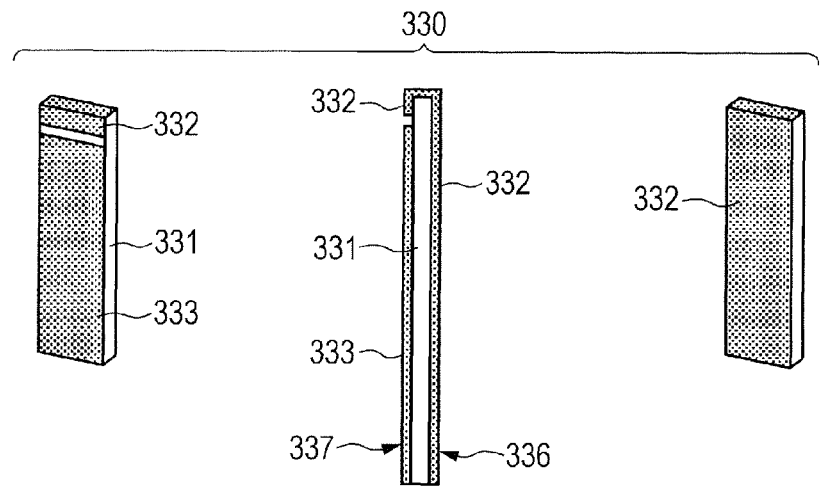
FIG. 11A is a schematic diagram illustrating a configuration of a piezoelectric element of the present invention illustrated in FIGS. 10A and 10B.
FIG. 11B is a schematic diagram illustrating a configuration of a piezoelectric element of the present invention illustrated in FIGS. 10A and 10B.
FIG. 11C is a schematic diagram illustrating a configuration of a piezoelectric element of the present invention illustrated in FIGS. 10A and 10B.

FIGS. 11A to 11C are schematic diagrams illustrating a configuration of the piezoelectric element 330 illustrated in FIGS. 10A and 10B. FIGS. 11A and 11C illustrate a front surface configuration and a rear surface configuration of the piezoelectric element 330, respectively. FIG. 11B illustrates a side surface configuration. As illustrated in FIGS. 11A to 11C, the piezoelectric element 330 includes a piezoelectric material 331, a first electrode 332, and a second electrode 333. The first electrode 332 and the second electrode 333 are disposed so as to be opposed to each other on the plate planes of the piezoelectric material 331. The front plane of the piezoelectric element 330 illustrated in FIG. 11C, on which the first electrode 332 is disposed, is referred to as a first electrode plane 336. The front plane of the piezoelectric element 330 illustrated in FIG. 11A, on which the second electrode 333 is disposed, is referred to as a second electrode plane 337.

In this case, the electrode plane in the present invention means a plane of the piezoelectric element on which the electrode is disposed. For example, as illustrated in FIGS. 11A to 11C, the first electrode 332 may extend around to the second electrode plane 337.

As illustrated in FIGS. 10A and 10B, as for the piezoelectric element 330 and the diaphragm 320, the plate surface of the diaphragm 320 is fixed to the first electrode plane 336 of the piezoelectric element 330. When the piezoelectric element 330 is driven, a stress is generated between the piezoelectric element 330 and the diaphragm 320 so that out-of-plane oscillation is generated in the diaphragm. The dust removing device 310 of the present invention is a device that removes foreign matters such as dust sticking to the surface of the diaphragm 320 by the out-of-plane oscillation of the diaphragm 320. The out-of-plane oscillation means elastic oscillation in which the diaphragm is displaced in the optical axis direction, namely in the thickness direction of the diaphragm.

Figures 12A, 12B:
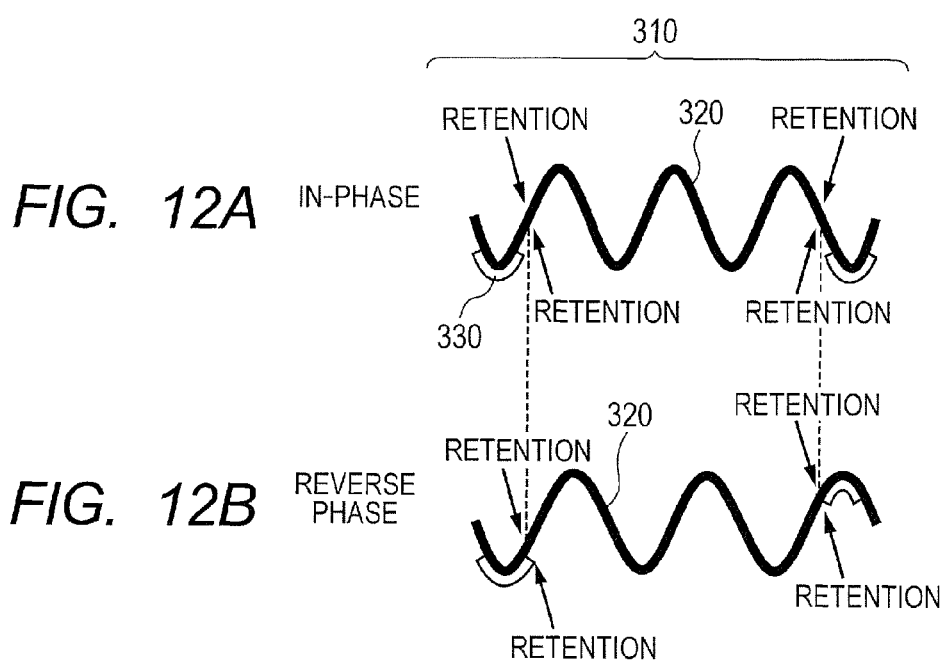
FIG. 12A is a schematic diagram illustrating a vibration principle of the dust removing device of the present invention.
FIG. 12B is a schematic diagram illustrating a vibration principle of the dust removing device of the present invention.

FIGS. 12A and 12B are schematic diagrams illustrating a vibration principle of the dust removing device 310 of the present invention. FIG. 12A illustrates a state in which alternating electric fields having the same phase are applied to a pair of left and right piezoelectric elements 330 so that the out-of-plane oscillation is generated in the diaphragm 320. The polarization direction of the piezoelectric material forming the pair of left and right piezoelectric elements 330 is the same as the thickness direction of the piezoelectric elements 330, and the dust removing device 310 is driven by the seventh oscillation mode. FIG. 12B illustrates a state in which alternating voltages having reverse phases by 180 degrees are applied to the pair of left and right piezoelectric elements 330 so that the out-of-plane oscillation is generated in the diaphragm 320. The dust removing device 310 is driven by the sixth oscillation mode. The dust removing device 310 of the present invention is a device that can effectively remove dust sticking to the surface of the diaphragm by using at least two oscillation modes selectively.

Figure 13:
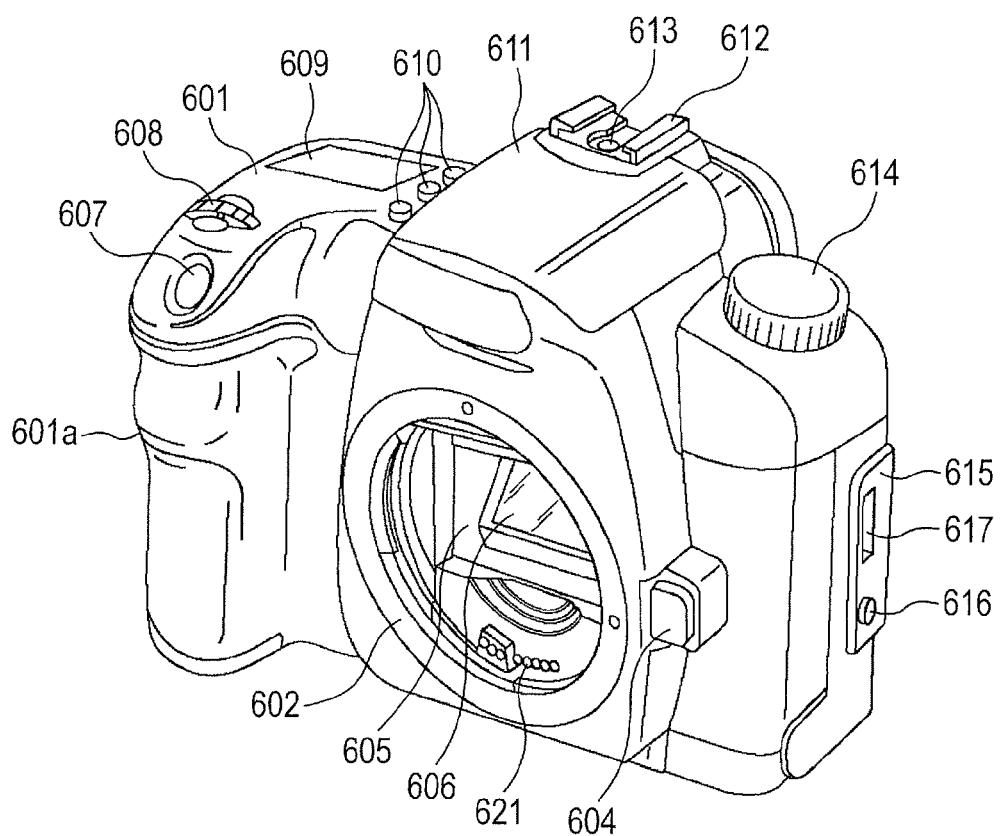
FIG. 13 is a schematic diagram illustrating an image pickup device according to an embodiment of the present invention.
Figure 14:
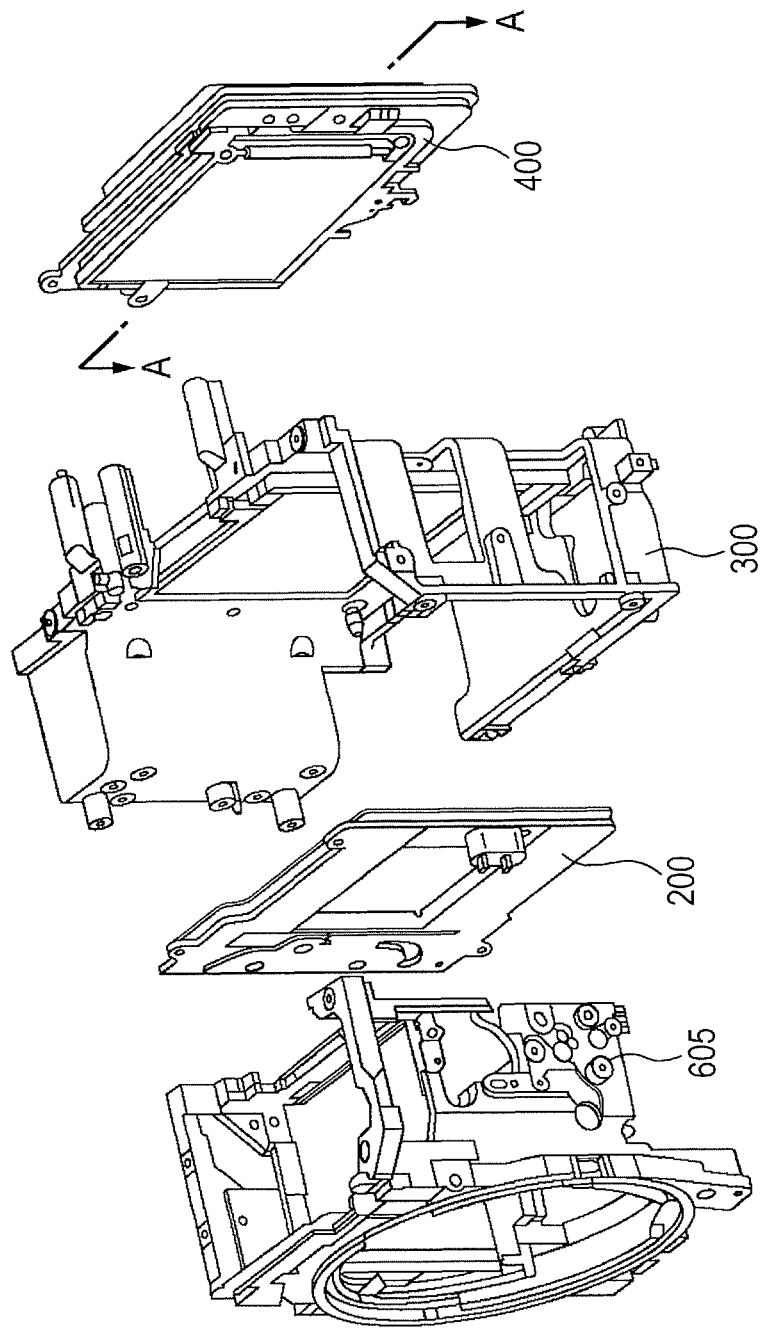
FIG. 14 is a schematic diagram illustrating the image pickup device according to the embodiment of the present invention.

Next, an image pickup device of the present invention is described. The image pickup device of the present invention is an image pickup device including at least the dust removing device and an image pickup element unit. The vibration member of the dust removing device and a light receiving plane of the image pickup element unit are sequentially disposed on the same axis. FIGS. 13 and 14 are diagrams illustrating a digital single lens reflex camera as an example of an image pickup device according to an exemplary embodiment of the present invention.

FIG. 13 is a front side perspective diagram of a camera main body 601 viewed from an object side, in which an imaging lens unit is removed. FIG. 14 is an exploded perspective diagram illustrating an internal schematic configuration of the camera for describing a peripheral structure of the dust removing device and an image pickup unit 400 of the present invention.

A mirror box 605 for guiding an imaging light beam that has passed through the imaging lens is disposed in the camera main body 601, and a main mirror (quick return mirror) 606 is disposed in the mirror box 605. The main mirror 606 can take one of states including a state of being supported at an angle of 45 degrees with respect to an imaging optical axis in order to guide the imaging light beam in the direction to a penta roof mirror (not shown) and a state of being retreated from the imaging light beam in order to guide the imaging light beam in the direction to an image pickup element (not shown).

On the object side of a main body chassis 300 to be a skeleton of the camera main body, the mirror box 605 and a shutter unit 200 are disposed in order from the object side. In addition, on a photographer side of the main body chassis 300, the image pickup unit 400 is disposed. The image pickup unit 400 is adjusted and disposed so that the imaging surface of the image pickup element is parallel to a mounting surface of a mount part 602 to be a reference for mounting the imaging lens unit with a predetermined distance.

In this case, the digital single lens reflex camera is described above as the image pickup device of the present invention, but the device may be a camera with interchangeable imaging lens unit such as a mirrorless digital single-lens camera without the mirror box 605, for example. In addition, the present invention can be applied to various types of image pickup devices or electronic and electric devices including the image pickup device, such as a video camera with interchangeable imaging lens unit, a copying machine, a facsimile, and a scanner, in particular, a device which is required to remove dust sticking to a surface of an optical component.

Next, an electronic apparatus of the present invention is described. The electronic apparatus of the present invention includes a piezoelectric acoustic component including the piezoelectric element or the multilayered piezoelectric element. As the piezoelectric acoustic component, there are a speaker, a buzzer, a microphone, and a surface acoustic wave (SAW) element.

Figure 15:
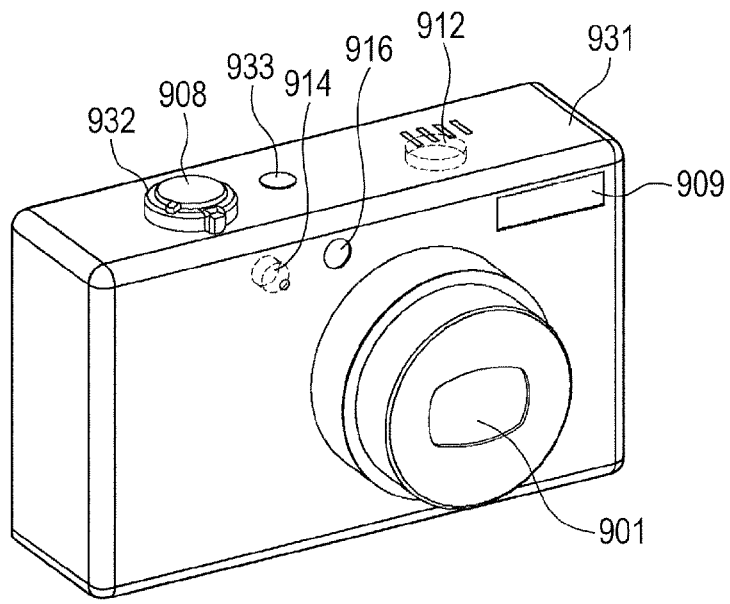
FIG. 15 is a schematic diagram illustrating an electronic apparatus according to an embodiment of the present invention.

FIG. 15 is a general perspective diagram of a main body 931 of a digital camera as an example of an electronic apparatus according to an exemplary embodiment of the present invention, as viewed from the front. On a front surface of the main body 931, there are disposed an optical apparatus 901, a microphone 914, a stroboscopic light emission unit 909, and a fill light unit 916. Because the microphone 914 is installed in the main body, the microphone 914 is illustrated by a broken line. In the front of the microphone 914, there is a hole shape provided for collecting external sound.

A power button 933, a speaker 912, a zoom lever 932, and a release button 908 for performing a focus operation are disposed on the top surface of the main body 931. The speaker 912 is installed in the main body 931 and is illustrated by a broken line. In the front of the speaker 912, there is a hole shape provided for transmitting sound to the outside.

The piezoelectric acoustic component of the present invention is used for at least one of the microphone 914, the speaker 912, and the surface acoustic wave element.

In this case, the digital camera is described above as the electronic apparatus of the present invention, but the present invention can also be applied to various types of the electronic apparatus including the piezoelectric acoustic component, such as a sound reproduction device, a sound recording device, a mobile phone, or an information terminal.

As described above, the piezoelectric element of the present invention is suitably applicable to the liquid discharge head, the ultrasonic motor, and the dust removing device.

The present invention provides a novel piezoelectric material that can achieve both high piezoelectric performance and high Curie temperature. Note that, the piezoelectric material of the present invention can be used in various applications such as a material for capacitors, a material for memories, and a material for sensors, utilizing its characteristic as dielectric.

Through the use of the piezoelectric material of the present invention, it is possible to provide the liquid discharge head having the same or higher nozzle density and discharge capacity than the case where the piezoelectric material containing lead is used.

Through the use of the piezoelectric material of the present invention, it is possible to provide the ultrasonic motor having the same or higher driving force and durability than the case where the piezoelectric material containing lead is used.

Through the use of the piezoelectric material of the present invention, it is possible to provide the dust removing device having the same or higher dust-removing efficiency than the case where the piezoelectric material containing lead is used.

Through the use of the dust removing device of the present invention, it is possible to provide the image pickup device having the same or higher dust-removing function than the case where the piezoelectric element containing lead is used.

Through the use of the piezoelectric acoustic component including the piezoelectric element or the multilayered piezoelectric element of the present invention, it is possible to provide the electronic apparatus having the same or higher sound producing performance than the case where the piezoelectric element containing lead is used.

The piezoelectric material of the present invention can be used in such a device as an ultrasonic oscillator, a piezoelectric actuator, a piezoelectric sensor, and a ferroelectric memory, as well as the liquid discharge head and the motor.

EXAMPLES

Examples of V-doped $BaTiO_3$—$BiFeO_3$—$Bi(Mg_{0.5}Ti_{0.5})O_3$

Examples 1 to 4 and Comparative Examples 1 to 4

(Manufacturing Method)

Barium titanate (manufactured by Sakai Chemical Industry Co., Ltd.: particle diameter: 100 nm), bismuth oxide (manufactured by RARE METALLIC Co., Ltd.: purity: 99.999%), iron oxide (manufactured by RARE METALLIC Co., Ltd.: purity: 99.9%), magnesium oxide (manufactured by RARE METALLIC Co., Ltd.: purity: 99.9%), titanium oxide (manufactured by ISHIHARA SANGYO KAISHA, LTD.: purity: 99.9%), and vanadium oxide ($V_2O_5$, manufactured by Kojundo Chemical Laboratory Co., Ltd.: purity: 99.9%) were used as raw materials. The raw materials were weighed so as to achieve each composition of Table 1 and wet-mixed in a ball mill through use of ethanol as a mixing medium for 24 hours, followed by drying at 80° C. The mixed powder was calcined at a temperature of 750° C. to 900° C. for 6 hours.

The calcined powder was pulverized and wet-mixed again in a ball mill through use of ethanol as a mixing medium for 16 hours. After that, polyvinyl alcohol (PVA) as a binder was added at 2 mass %, and the components were mixed in the ball mill for 1 hour, followed by drying at 80° C., to yield granulated powder.

Next, the resultant granulated powder was pulverized and subjected to particle size selection with a 250-μm-mesh sieve. The powder obtained after the particle size selection was filled into a mold and uniaxially pressed at a pressure of 200 MPa to produce a disc-shaped compact having a diameter of 10 mm.

Then, the resultant compact was heated at 700° C. for 10 hours to remove the binder, and fired at 800° C. to 1,000° C. for 6 hours to yield a sintered body formed of the piezoelectric material of the present invention. After that, the resultant sintered body was polished so as to have a thickness of 0.4 mm.

Structure Evaluations

The composition of the polished sintered body was evaluated by X-ray fluorescence analysis (XRF) in which a calibration curve was prepared using composition known samples evaluated by ICP mass spectrometry.

The crystal structure of the sintered body was evaluated by 2θ-θ measurement of X-ray diffraction (XRD).

The density of the sintered body was evaluated by the Archimedes method. The relative density was determined as a ratio of a measured density to a theoretical density determined from the crystal structure analysis of the XRD.

The average equivalent circular diameter and maximum equivalent circular diameter of the crystal grain of the sintered body were observed with a scanning electron microscope (SEM), and the average equivalent circular diameter was determined as a number average.

Electric Property Evaluations

In order to evaluate the electric properties of the polished sintered body, the sintered body was processed into a strip shape having a thickness of 0.4 mm, a length of 4 mm, and a width of 1.5 mm, and silver electrodes were formed on both the front and back surfaces of the sintered body to produce the piezoelectric element of the present invention.

The piezoelectric property was evaluated by determining a piezoelectric constant $d_{33}$* from the slope of an electric field and a strain in an electric field-strain curve. As a value for the strain, a value when an AC electric field of 0.1 Hz was applied at 60 kV/cm was adopted, and the piezoelectric constant was calculated.

Further, the Curie temperature was determined from a peak position of temperature dependence of a dielectric constant. The temperature dependence of the dielectric constant was determined by measuring the dielectric constant at 1 MHz every 10° C. at a temperature increase rate of 3° C./min.

The dielectric breakdown electric field was measured as an electric field causing dielectric breakdown when a DC electric field of 2 kV/cm or more was applied for 1 minute and the electric field was increased in increments of 2 kV/cm.

The results are summarized in Table 1. In the table, x, y, and z in the column "Composition" represent molar ratios of $BaTiO_3$, $BiFeO_3$, and $Bi(Mg_{0.5}Ti_{0.5})O_3$, respectively. V represents an amount (mol) of V doped per mol of $BaTiO_3$—$BiFeO_3$—$Bi(Mg_{0.5}Ti_{0.5})O_3$. In the column "Crystal structure," the presence of only the perovskite-type structure and the presence of a secondary phase are expressed as Symbols "o" and "x", respectively.

TABLE 1

| | Composition | | | | Structure evaluations | | | | Electric properties | | |
|---|---|---|---|---|---|---|---|---|---|---|---|
| | | | | | Crystal structure | Density [%] | Average equivalent circular diameter [μm] | Maximum equivalent circular diameter [μm] | Piezoelectric constant d33* [pm/V] | Curie temperature [° C.] | Dielectric breakdown electric field [kV/cm] |
| | x | y | z | V | | | | | | | |
| Example 1 | 0.30 | 0.60 | 0.10 | 0.0005 | o | 92 | 3.6 | 8.2 | 300 | 440 | 70 |
| Example 2 | 0.30 | 0.60 | 0.10 | 0.0010 | o | 92 | 3.4 | 8.0 | 390 | 440 | 100 |
| Example 3 | 0.30 | 0.60 | 0.10 | 0.0020 | o | 92 | 3.6 | 8.1 | 550 | 440 | 120 |
| Example 4 | 0.30 | 0.60 | 0.10 | 0.0050 | o | 92 | 3.5 | 8.3 | 400 | 440 | 80 |
| Comparative Example 1 | 0.30 | 0.60 | 0.10 | 0 | o | 92 | 3.6 | 8.3 | 250 | 440 | 4 |
| Comparative Example 2 | 0.30 | 0.60 | 0.10 | 0.0100 | o | 92 | 3.5 | 8.2 | 240 | 440 | 4 |
| Comparative Example 3 | 0 | 1.0 | 0 | 0 | o | 88 | 8.0 | 18.0 | 20 | >600 | Less than 2 |
| Comparative Example 4 | 0 | 1.0 | 0 | 0.0050 | x | 83 | 8.0 | 18.0 | 10 | >600 | Less than 2 |

The results of the X-ray fluorescence analysis revealed that the compositions as weighed were kept even after the sintering.

Figure 16:
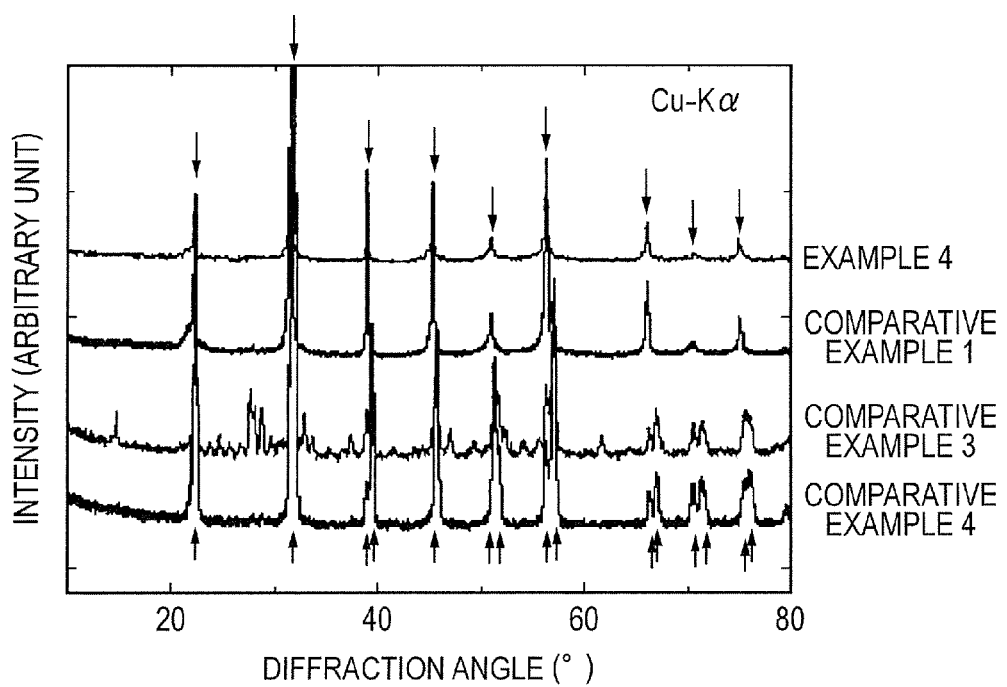
FIG. 16 is an X-ray diffraction diagram of Example 4 and Comparative Examples 1, 3, and 4.

In the structure evaluations, the structure analysis (2θ-θ measurement) using X-ray diffraction revealed that the crystal structure was only the perovskite-type structure except for Comparative Example 4. In this connection, FIG. 16 shows X-ray diffraction patterns of Example 4 and Comparative Examples 1, 3, and 4. In the figure, the down arrows indicate diffraction peaks appearing in a cubic perovskite structure, and the up arrows indicate diffraction peaks appearing in a rhombohedral perovskite structure. In Example 4 and Comparative Example 1 satisfying the compositional region of FIG. 1, irrespective of the presence or absence of V doping, the crystal structure was only the perovskite-type structure. However, there was a large difference in dielectric breakdown electric field between the presence and absence of V doping. In the absence of V doping, dielectric breakdown occurs at a relatively small DC electric field intensity. On the other hand, the V-doped sintered body, which fell within the scope of the present invention, exhibited satisfactory insulation property such as exhibiting a resistance of several minutes to several tens of minutes or more to a DC electric field of 80 kV/cm or more. Further, the V-doped sintered body had good insulation property and hence exhibited as high piezoelectric performance as $d_{33}$*=400 μm/V. Similarly, the sintered bodies of Examples 1, 2, and 3 also exhibited so high insulation property that a high DC electric field of 70 kV/cm or more was applicable for several minutes to several tens of minutes or more and as high piezoelectric performance as $d_{33}$*=300 μm/V or more. The Curie temperature was 200° C. or more in all the cases. Further, in the samples of Examples, the average equivalent circular diameter of the crystal grain fell within the range of 0.5 μm or more and 5.0 μm or less, and the maximum equivalent circular diameter of the crystal grain fell within the range of 5.2 μm or more and 9.8 μm or less.

Comparative Example 3, which does not fall within the scope of the present invention, is $BiFeO_3$ alone and exhibits a rhombohedral perovskite structure. Similarly, Comparative Example 4, which does not fall within the scope of the present invention, has 0.0050 mol of V doped per mol of $BiFeO_3$. As shown in FIG. 16, each of the comparative examples exhibited a rhombohedral perovskite structure. However, the comparative example in which V was not doped (Comparative Example 3) had only the perovskite structure, whereas diffraction peaks attributed to a large amount of a secondary phase appeared in the comparative example in which V was doped. The generation of the secondary phase due to the V doping was observed not only in the sintered body but also in the powder immediately after calcination. $BiFeO_3$ alone originally has low insulation property, and thus a high electric field cannot be applied thereto, with the result that high piezoelectric performance cannot be obtained. Comparative Example 3 exhibited such electric properties as described above. In Comparative Example 4, even when V was doped into $BiFeO_3$ alone, no improvement in insulation property was observed. Therefore, no improvement in piezoelectric performance was observed, and moreover, a secondary phase was generated, with the result that piezoelectric performance even lower than that in Comparative Example 3 was exhibited.

Examples of V-doped $BaTiO_3$—$BiFeO_3$—Bi $(Mg_{0.5}Ti_{0.5})O_3$, Part 2

Examples 5 to 19 and Comparative Examples 5 to 10

(Manufacturing Method)

Barium titanate (manufactured by Sakai Chemical Industry Co., Ltd.: particle diameter: 100 nm), bismuth oxide (manufactured by RARE METALLIC Co., Ltd.: purity: 99.999%), iron oxide (manufactured by RARE METALLIC Co., Ltd.: purity: 99.9%), magnesium oxide (manufactured by RARE METALLIC Co., Ltd.: purity: 99.9%), titanium oxide (manufactured by ISHIHARA SANGYO KAISHA, LTD.: purity: 99.9%), and vanadium oxide ($V_2O_5$, manufactured by Kojundo Chemical Laboratory Co., Ltd.: purity: 99.9%) were used as raw materials. The raw materials were weighed so as to achieve each composition of Table 2, and a sintered body was produced by the same method as that in Examples 1 to 4.

Structure Evaluations

The polished sintered body was evaluated for its composition, crystal structure, density, and average equivalent circular diameter and maximum equivalent circular diameter of a crystal grain by the same methods as those in Examples 1 to 4.

Electric Property Evaluations

The polished sintered body was evaluated for its electric properties by the same methods as those in Examples 1 to 16. In this regard, however, in the evaluation of the dielectric breakdown electric field, the electric field increments were increased in order to perform the evaluation efficiently and quickly.

The results are summarized in Table 2. In the table, x, y, and z in the column "Composition" represent molar ratios of $BaTiO_3$, $BiFeO_3$, and $Bi(Mg_{0.5}Ti_{0.5})O_3$, respectively. V represents an amount (mol) of V doped per mol of $BaTiO_3$—$BiFeO_3$—$Bi(Mg_{0.5}Ti_{0.5})O_3$. In the column "Crystal structure," the presence of only the perovskite-type structure and the presence of a secondary phase are expressed as Symbols "o" and "x", respectively. The dielectric breakdown electric field was measured while increasing the electric field increments in order to perform the measurement quickly, and hence a case of 50 kV/cm or more was expressed as Symbol "o", a case of 5 kV/cm or more and less than 50 kV/cm was expressed as Symbol "Δ", and a case of less than 5 kV/cm was expressed as Symbol "x" instead of such numerical values as shown Table 1.

TABLE 2

| | Composition | | | | Crystal structure | Density [%] | Structure evaluations Average equivalent circular diameter [μm] | Maximum equivalent circular diameter [μm] | Electric properties Piezoelectric constant d33* [pm/V] | Curie temperature [° C.] | Dielectric breakdown electric field |
|---|---|---|---|---|---|---|---|---|---|---|---|
| | x | y | z | V | | | | | | | |
| Example 5 | 0.75 | 0.15 | 0.10 | 0.0040 | o | 92 | 0.5 | 5.2 | 190 | 200 | o |
| Example 6 | 0.75 | 0.20 | 0.05 | 0.0040 | o | 91 | 2.1 | 6.3 | 170 | 210 | o |
| Example 7 | 0.70 | 0.20 | 0.10 | 0.0040 | o | 93 | 2.0 | 6.2 | 200 | 210 | o |
| Example 8 | 0.60 | 0.30 | 0.10 | 0.0040 | o | 92 | 2.2 | 6.4 | 160 | 230 | o |
| Example 9 | 0.55 | 0.20 | 0.25 | 0.0040 | o | 91 | 2.0 | 6.1 | 210 | 220 | o |
| Example 10 | 0.55 | 0.40 | 0.05 | 0.0005 | o | 91 | 2.9 | 7.2 | 260 | 290 | o |
| Example 11 | 0.50 | 0.40 | 0.10 | 0.0005 | o | 92 | 2.6 | 7.1 | 240 | 290 | o |
| Example 12 | 0.45 | 0.35 | 0.20 | 0.0005 | o | 91 | 2.5 | 6.9 | 350 | 300 | o |
| Example 13 | 0.40 | 0.20 | 0.40 | 0.0005 | o | 92 | 1.5 | 5.7 | 110 | 200 | o |
| Example 14 | 0.40 | 0.30 | 0.30 | 0.0005 | o | 91 | 2.7 | 6.5 | 180 | 340 | o |
| Example 15 | 0.40 | 0.45 | 0.15 | 0.0020 | o | 91 | 3.1 | 7.5 | 300 | 280 | o |
| Example 16 | 0.30 | 0.20 | 0.50 | 0.0020 | o | 92 | 1.4 | 5.8 | 130 | 390 | o |
| Example 17 | 0.25 | 0.15 | 0.60 | 0.0020 | o | 92 | 0.5 | 5.3 | 115 | 400 | o |
| Example 18 | 0.25 | 0.50 | 0.25 | 0.0020 | o | 92 | 5.0 | 9.8 | 230 | 380 | o |
| Example 19 | 0.25 | 0.70 | 0.05 | 0.0020 | o | 93 | 4.7 | 9.1 | 220 | 450 | o |

TABLE 2-continued

| | Composition | | | | Structure evaluations | | | | Electric properties | | |
|---|---|---|---|---|---|---|---|---|---|---|---|
| | | | | | Crystal structure | Density [%] | Average equivalent circular diameter [μm] | Maximum equivalent circular diameter [μm] | Piezoelectric constant d33* [pm/V] | Curie temperature [° C.] | Dielectric breakdown electric field |
| | x | y | z | V | | | | | | | |
| Comparative Example 5 | 0.80 | 0.10 | 0.10 | 0.0005 | o | 91 | 0.4 | 3.9 | 170 | 70 | o |
| Comparative Example 6 | 0.50 | 0.10 | 0.40 | 0.0005 | o | 92 | 0.4 | 4.2 | 55 | 240 | o |
| Comparative Example 7 | 0.40 | 0.10 | 0.50 | 0.0005 | o | 90 | 0.3 | 3.1 | 70 | 260 | o |
| Comparative Example 8 | 0.20 | 0.40 | 0.40 | 0.0005 | o | 91 | 8.6 | 20.1 | 65 | 510 | o |
| Comparative Example 9 | 0.20 | 0.70 | 0.10 | 0.0010 | o | 91 | 7.9 | 17.5 | 40 | 520 | Δ |
| Comparative Example 10 | 0.10 | 0.10 | 0.80 | 0.0010 | x | 82 | 7.8 | 16.2 | Unable to be evaluated | Unable to be evaluated | Not evaluated |

The results of the X-ray fluorescence analysis revealed that the compositions as weighed were kept even after the sintering.

In the structure evaluations, the structure analysis (2θ-θ measurement) using X-ray diffraction revealed that the crystal structure was only the perovskite-type structure except for Comparative Example 10. The samples of Examples exhibited satisfactory insulation property such as exhibiting a resistance of several minutes to several tens of minutes or more to a DC electric field of 50 kV/cm or more. In addition, the samples of Examples exhibited as high piezoelectric performance as $d_{33}^*=110$ μm/V or more, and had a Curie temperature of 200° C. or more. Further, in the samples of Examples, the average equivalent circular diameter of the crystal grain fell within the range of 0.5 μm or more and 5.0 μm or less, and the maximum equivalent circular diameter of the crystal grain fell within the range of 5.2 μm or more and 9.8 μm or less.

Examples of Mn-Doped $BaTiO_3$—$BiFeO_3$—$Bi(Mg_{0.5}Ti_{0.5})O_3$

Comparative Examples 11 to 13

(Manufacturing Method)

Barium titanate (manufactured by Sakai Chemical Industry Co., Ltd.: particle diameter: 100 nm), bismuth oxide (manufactured by RARE METALLIC Co., Ltd.: purity: 99.999%), iron oxide (manufactured by RARE METALLIC Co., Ltd.: purity: 99.9%), magnesium oxide (manufactured by RARE METALLIC Co., Ltd.: purity: 99.9%), titanium oxide (manufactured by ISHIHARA SANGYO KAISHA, LTD.: purity: 99.9%), and manganese carbonate (manufactured by Kojundo Chemical Laboratory Co., Ltd.: purity: 99.9%) were used as raw materials. The raw materials were weighed so as to achieve each composition of Table 3, and a sintered body was produced by the same method as that in Examples 1 to 4.

Structure Evaluations

The polished sintered body was evaluated for its composition, crystal structure, density, and average equivalent circular diameter and maximum equivalent circular diameter of a crystal grain by the same methods as those in Examples 1 to 19.

Electric Property Evaluations

The polished sintered body was evaluated for its electric properties by the same methods as those in Examples 5 to 19.

The results are summarized in Table 3. In the table, x, y, and z in the column "Composition" represent molar ratios of $BaTiO_3$, $BiFeO_3$, and $Bi(Mg_{0.5}Ti_{0.5})O_3$, respectively. "Mn amount" represents a mass of Mn with respect to 100 parts by mass of $BaTiO_3$—$BiFeO_3$—$Bi(Mg_{0.5}Ti_{0.5})O_3$. In the column "Crystal structure," the presence of only the perovskite-type structure and the presence of a secondary phase are expressed as Symbols "o" and "x", respectively. With regard to the dielectric breakdown electric field, a case of 50 kV/cm or more was expressed as Symbol "o", a case of 5 kV/cm or more and less than 50 kV/cm was expressed as Symbol "Δ", and a case of less than 5 kV/cm was expressed as Symbol "x".

TABLE 3

| | Composition | | | | Structure evaluations | | Electric properties | | |
|---|---|---|---|---|---|---|---|---|---|
| | x | y | z | Mn amount [mass %] | Crystal structure | Density [%] | Piezoelectric constant d33* [pm/V] | Curie temperature [° C.] | Dielectric breakdown electric field |
| Comparative Example 11 | 0.75 | 0.15 | 0.10 | 0.05 | o | 95 | 190 | 200 | Δ |
| Comparative Example 12 | 0.60 | 0.30 | 0.10 | 0.50 | o | 95 | 160 | 230 | Δ |
| Comparative Example 13 | 0.40 | 0.20 | 0.40 | 3.00 | o | 94 | 110 | 200 | Δ |

The results of the X-ray fluorescence analysis revealed that the compositions as weighed were kept even after the sintering.

In the structure evaluations, the structure analysis (2θ-θ measurement) using X-ray diffraction revealed that the crystal structure was only the perovskite-type structure. In each of the samples, the density was as satisfactory as 94% or more, the average equivalent circular diameter of the crystal grain fell within the range of 1.0 μm or more and 4.2 μm or less, and the maximum equivalent circular diameter of the crystal grain fell within the range of 5.4 μm or more and 9.9 μm or less. In the electric property evaluations, the piezoelectric performance was as high as $d_{33}^*$=110 μm/V or more, and the Curie temperature was 200° C. or more. However, the resistance to the application of a high DC electric field was less than 50 kV/cm in each of Comparative Examples 11, 12, and 13. In general, the effect of Mn doping resides in an improvement in insulation property, and an insulation property improving effect against the application of a high AC electric field (e.g., an AC electric field having a frequency of 0.1 Hz and an amplitude of 80 kV/cm) is found to some extent in the above-mentioned comparative examples. However, regarding the resistance to the application of a high DC electric field, satisfactory property comparable to those of Examples 5, 8, and 13 as V-doped samples could not be obtained.

Examples of V-Doped $BaTiO_3$—$BiFeO_3$—$Bi(Ni_{0.5}Ti_{0.5})O_3$

Examples 20 to 29 and Comparative Examples 14 to 17

(Manufacturing Method A: Normal Sintering Method)

Barium titanate (manufactured by Sakai Chemical Industry Co., Ltd.: particle diameter: 100 nm), bismuth oxide (manufactured by RARE METALLIC Co., Ltd.: purity: 99.999%), iron oxide (manufactured by RARE METALLIC Co., Ltd.: purity: 99.9%), nickel oxide (manufactured by RARE METALLIC Co., Ltd.: purity: 99.9%), titanium oxide (manufactured by ISHIHARA SANGYO KAISHA, LTD.: purity: 99.9%), and vanadium oxide ($V_2O_5$, manufactured by Kojundo Chemical Laboratory Co., Ltd.: purity: 99.9%) were used as raw materials. The raw materials were weighed so as to achieve each composition of Table 4 and wet-mixed in a ball mill through use of ethanol as a mixing medium for 24 hours, followed by drying at 80° C. The mixed powder was calcined at a temperature of 750° C. to 850° C. for 6 hours.

The calcined powder was pulverized and wet-mixed again in a ball mill through use of ethanol as a mixing medium for 16 hours. Subsequently, the mixed powder was dried at 80° C. and then calcined again at a temperature of 850° C. to 900° C. for 6 hours. After that, PVA as a binder was added at 2 mass %, and the components were mixed in the ball mill for 1 hour, followed by drying at 80° C., to yield granulated powder.

Next, the resultant granulated powder was pulverized and subjected to particle size selection with a 250-μm-mesh sieve. The powder obtained after the particle size selection was filled into a mold and uniaxially pressed at a pressure of 200 MPa to produce a disc-shaped compact having a diameter of 10 mm.

Then, the resultant compact was heated at 500° C. for 10 hours to remove the binder, and fired at 950° C. to 1,030° C. for 6 hours to yield a sintered body. After that, the resultant sintered body was polished so as to have a thickness of 0.4 mm.

Manufacturing Method B: Tape Casting Method

Barium titanate (manufactured by Sakai Chemical Industry Co., Ltd.: particle diameter: 100 nm), bismuth oxide (manufactured by RARE METALLIC Co., Ltd.: purity: 99.999%), iron oxide (manufactured by RARE METALLIC Co., Ltd.: purity: 99.9%), nickel oxide (manufactured by RARE METALLIC Co., Ltd.: purity: 99.9%), titanium oxide (manufactured by ISHIHARA SANGYO KAISHA, LTD.: purity: 99.9%), and vanadium oxide ($V_2O_5$, manufactured by Kojundo Chemical Laboratory Co., Ltd.: purity: 99.9%) were used as raw materials. The raw materials were weighed so as to achieve each composition of Table 4 and wet-mixed in a ball mill through use of ethanol as a mixing medium for 24 hours, followed by drying at 80° C. The mixed powder was calcined at a temperature of 750° C. to 850° C. for 6 hours.

The calcined powder was pulverized and wet-mixed again in a ball mill through use of ethanol as a mixing medium for 16 hours. Subsequently, the mixed powder was dried at 80° C. and then calcined again at a temperature of 850° C. to 900° C. for 6 hours. After that, a mixed solution containing 55 vol % of toluene and 45 vol % of ethanol was added at 90 mass % with respect to the mixed powder. Into the mixture, polyvinylpyrrolidone (PVP) having a weight average molecular weight of 400,000 as a binder and a plasticizer (butyl phthalate) were each blended at 6 mass % with respect to the amount of the powder. The mixture was wet-mixed in a ball mill for 5 hours to produce a slurry.

Next, the slurry was formed into a tape shape having a thickness of 40 to 45 μm with a doctor blade apparatus, followed by drying. In addition, the tape was cut out into a size of 2×2 cm², and 40 sheets of the tape were stacked and then subjected to compression bonding under the conditions of 80° C.×100 kg/cm² (9.8 MPa)×10 minutes to yield a compact having a thickness of 1.8 mm.

Then, the resultant compact was heated at 650° C. for 10 hours to remove the binder, and fired at 950° C. to 1,030° C. for 6 hours to yield a sintered body. After that, the resultant sintered body was polished so as to have a thickness of 0.4 mm.

Structure Evaluations

The polished sintered body was evaluated for its composition, crystal structure, density, and average equivalent circular diameter and maximum equivalent circular diameter of a crystal grain by the same methods as those in Examples 1 to 19.

Electric Property Evaluations

The polished sintered body was evaluated for its electric properties by the same methods as those in Examples 5 to 19.

The results are summarized in Table 4. In the table, x, y, and z in the column "Composition" represent molar ratios of $BaTiO_3$, $BiFeO_3$, and $Bi(Ni_{0.5}Ti_{0.5})O_3$, respectively. V represents an amount (mol) of V doped per mol of $BaTiO_3$—$BiFeO_3$—$Bi(Ni_{0.5}Ti_{0.5})O_3$. In the column "Crystal structure," the presence of only the perovskite-type structure and the presence of a secondary phase are expressed as Symbols "o" and "x", respectively. The dielectric breakdown electric field was measured while increasing the electric field increments in order to perform the measurement quickly, and hence a case of 50 kV/cm or more was expressed as Symbol "o", a case of 5 kV/cm or more and less than 50 kV/cm was expressed as Symbol "Δ", and a case of less than 5 kV/cm was expressed as Symbol "x" instead of such numerical values as shown Table 1.

TABLE 4

| | Manufacturing method | Composition | | | | Crystal structure | Density [%] | Structure evaluations | | Electric properties | | |
| | | | | | | | | Average equivalent circular diameter [μm] | Maximum equivalent circular diameter [μm] | Piezoelectric constant d33* [pm/V] | Curie temperature [° C.] | Dielectric breakdown electric field |
| --- | --- | --- | --- | --- | --- | --- | --- | --- | --- | --- | --- | --- |
| | | x | y | z | V | | | | | | | |
| Example 20 | A | 0.75 | 0.15 | 0.10 | 0.0040 | ○ | 91 | 0.9 | 6.5 | 145 | 200 | ○ |
| Example 21 | A | 0.75 | 0.20 | 0.05 | 0.0040 | ○ | 92 | 3.0 | 8.1 | 130 | 220 | ○ |
| Example 22 | A | 0.70 | 0.20 | 0.10 | 0.0040 | ○ | 92 | 3.3 | 7.9 | 115 | 240 | ○ |
| Example 23 | A | 0.55 | 0.30 | 0.25 | 0.0040 | ○ | 92 | 2.9 | 6.1 | 170 | 220 | ○ |
| Example 24 | B | 0.55 | 0.40 | 0.05 | 0.0005 | ○ | 98 | 3.8 | 7.2 | 200 | 280 | ○ |
| Example 25 | B | 0.50 | 0.40 | 0.10 | 0.0005 | ○ | 97 | 3.7 | 7.1 | 180 | 300 | ○ |
| Example 26 | B | 0.45 | 0.35 | 0.20 | 0.0005 | ○ | 97 | 3.9 | 8.4 | 250 | 290 | ○ |
| Example 27 | A | 0.30 | 0.60 | 0.10 | 0.0005 | ○ | 91 | 2.1 | 7.4 | 190 | 420 | ○ |
| Example 28 | A | 0.25 | 0.50 | 0.25 | 0.0005 | ○ | 92 | 5.0 | 9.8 | 170 | 360 | ○ |
| Example 29 | B | 0.25 | 0.70 | 0.05 | 0.0005 | ○ | 98 | 4.8 | 8.6 | 165 | 430 | ○ |
| Comparative Example 14 | A | 0.80 | 0.10 | 0.10 | 0.0005 | ○ | 91 | 0.3 | 3.9 | 120 | 60 | ○ |
| Comparative Example 15 | A | 0.50 | 0.10 | 0.40 | 0.0005 | ○ | 91 | 0.4 | 4.2 | 50 | 230 | ○ |
| Comparative Example 16 | B | 0.20 | 0.70 | 0.10 | 0.0005 | ○ | 97 | 9.1 | 21.1 | 45 | 500 | Δ |
| Comparative Example 17 | A | 0.10 | 0.10 | 0.80 | 0.0005 | x | 82 | 8.9 | 20.2 | Unable to be evaluated | Unable to be evaluated | Not evaluated |

The results of the X-ray fluorescence analysis revealed that the compositions as weighed were kept even after the sintering.

In the structure evaluations, the structure analysis using X-ray diffraction revealed that the crystal structure was only the perovskite-type structure except for Comparative Example 17. The samples of Examples exhibited satisfactory insulation property such as exhibiting a resistance of several minutes to several tens of minutes or more to a DC electric field of 50 kV/cm or more. In addition, the samples of Examples exhibited as high piezoelectric performance as $d_{33}^*=115$ pm/V or more, and had a Curie temperature of 200° C. or more.

The results reveal that the density was a relative density of 90% or more in each of the samples having only the perovskite-type structure, and the relative density became higher (97% or more) in the case of employing the tape casting method. In the samples of Examples, the average equivalent circular diameter of the crystal grain was 0.9 μm or more and 5.0 μm or less, and the maximum equivalent circular diameter of the crystal grain was 6.1 μm or more and 9.8 μm or less.

Examples of V-Doped BaTiO$_3$—BiFeO$_3$—Bi(Zn$_{0.5}$Ti$_{0.5}$)O$_3$

Examples 30 to 39 and Comparative Examples 18 to 21

(Manufacturing Method A: Normal Sintering Method)

Barium titanate (manufactured by Sakai Chemical Industry Co., Ltd.: particle diameter: 100 nm), bismuth oxide (manufactured by RARE METALLIC Co., Ltd.: purity: 99.999%), iron oxide (manufactured by RARE METALLIC Co., Ltd.: purity: 99.9%), zinc oxide (manufactured by RARE METALLIC Co., Ltd.: purity: 99.9%), titanium oxide (manufactured by ISHIHARA SANGYO KAISHA, LTD.: purity: 99.9%), and vanadium oxide (V$_2$O$_5$, manufactured by Kojundo Chemical Laboratory Co., Ltd.: purity: 99.9%) were used as raw materials. The raw materials were weighed so as to achieve each composition of Table 4 and wet-mixed in a ball mill through use of ethanol as a mixing medium for 24 hours, followed by drying at 80° C. The mixed powder was calcined at a temperature of 750° C. to 850° C. for 6 hours.

The calcined powder was pulverized and wet-mixed again in a ball mill through use of ethanol as a mixing medium for 16 hours. Subsequently, the mixed powder was dried at 80° C. and then calcined again at a temperature of 850° C. to 900° C. for 6 hours. After that, PVA as a binder was added at 2 mass %, and the components were mixed in the ball mill for 1 hour, followed by drying at 80° C., to yield granulated powder.

Next, the resultant granulated powder was pulverized and subjected to particle size selection with a 250-μm-mesh sieve. The powder obtained after the particle size selection was filled into a mold and uniaxially pressed at a pressure of 200 MPa to produce a disc-shaped compact having a diameter of 10 mm.

Then, the resultant compact was heated at 500° C. for 10 hours to remove the binder, and fired at 950° C. to 1,030° C. for 6 hours to yield a sintered body. After that, the resultant sintered body was polished so as to have a thickness of 0.4 mm.

Manufacturing Method B: Tape Casting Method

Barium titanate (manufactured by Sakai Chemical Industry Co., Ltd.: particle diameter: 100 nm), bismuth oxide (manufactured by RARE METALLIC Co., Ltd.: purity: 99.999%), iron oxide (manufactured by RARE METALLIC Co., Ltd.: purity: 99.9%), zinc oxide (manufactured by RARE METALLIC Co., Ltd.: purity: 99.9%), titanium oxide (manufactured by ISHIHARA SANGYO KAISHA, LTD.: purity: 99.9%), and vanadium oxide (V$_2$O$_5$, manufactured by Kojundo Chemical Laboratory Co., Ltd.: purity: 99.9%) were used as raw materials. The raw materials were weighed so as to achieve each composition of Table 4 and wet-mixed in a ball mill through use of ethanol as a mixing medium for 24 hours, followed by drying at 80° C. The mixed powder was calcined at a temperature of 750° C. to 850° C. for 6 hours.

The calcined powder was pulverized and wet-mixed again in a ball mill through use of ethanol as a mixing medium for 16 hours. Subsequently, the mixed powder was dried at 80° C. and then calcined again at a temperature of 850° C. to 900° C. for 6 hours. After that, a mixed solution containing 55 vol % of toluene and 45 vol % of ethanol was added at 90 mass % with respect to the mixed powder. Into the mixture, polyvinylpyrrolidone (PVP) having a weight average molecular weight of 400,000 as a binder and a plasticizer (butyl phthalate) were each blended at 6 mass % with respect to the amount of the powder. The mixture was wet-mixed in a ball mill for 5 hours to produce a slurry.

Next, the slurry was formed into a tape shape having a thickness of 40 to 45 μm with a doctor blade apparatus, followed by drying. In addition, the tape was cut out into a size of 2×2 cm², and 40 sheets of the tape were stacked and then subjected to compression bonding under the conditions of 80° C.×100 kg/cm² (9.8 MPa)×10 minutes to yield a compact having a thickness of 1.8 mm.

Then, the resultant compact was heated at 650° C. for 10 hours to remove the binder, and fired at 950° C. to 1,030° C. for 6 hours to yield a sintered body. After that, the resultant sintered body was polished so as to have a thickness of 0.4 mm.

Structure Evaluations

The polished sintered body was evaluated for its composition, crystal structure, density, and average equivalent circular diameter and maximum equivalent circular diameter of a crystal grain by the same methods as those in Examples 1 to 29.

Electric Property Evaluations

The polished sintered body was evaluated for its electric properties by the same methods as those in Examples 5 to 29.

The results are summarized in Table 5. In the table, x, y, and z in the column "Composition" represent molar ratios of $BaTiO_3$, $BiFeO_3$, and $Bi(Zn_{0.5}Ti_{0.5})O_3$, respectively. V represents an amount (mol) of V doped per mol of $BaTiO_3$—$BiFeO_3$—$Bi(Zn_{0.5}Ti_{0.5})O_3$. In the column "Crystal structure," the presence of only the perovskite-type structure and the presence of a secondary phase are expressed as Symbols "o" and "x", respectively. The dielectric breakdown electric field was measured while increasing the electric field increments in order to perform the measurement quickly, and hence a case of 50 kV/cm or more was expressed as Symbol "o", a case of 5 kV/cm or more and less than 50 kV/cm was expressed as Symbol "t", and a case of less than 5 kV/cm was expressed as Symbol "x" instead of such numerical values as shown Table 1.

TABLE 5

| | Manufacturing method | Composition | | | | Crystal structure | Density [%] | Average equivalent circular diameter [μm] | Maximum equivalent circular diameter [μm] | Piezoelectric constant d33* [pm/V] | Curie temperature [° C.] | Dielectric breakdown electric field |
|---|---|---|---|---|---|---|---|---|---|---|---|---|
| | | x | y | z | V | | | | | | | |
| Example 30 | A | 0.75 | 0.15 | 0.10 | 0.0040 | o | 90 | 0.8 | 6.3 | 155 | 210 | o |
| Example 31 | A | 0.75 | 0.20 | 0.05 | 0.0040 | o | 91 | 2.8 | 7.9 | 140 | 230 | o |
| Example 32 | A | 0.70 | 0.20 | 0.10 | 0.0040 | o | 91 | 3.1 | 7.7 | 125 | 250 | o |
| Example 33 | A | 0.55 | 0.30 | 0.25 | 0.0040 | o | 91 | 2.8 | 5.9 | 180 | 230 | o |
| Example 34 | B | 0.55 | 0.40 | 0.05 | 0.0005 | o | 97 | 3.6 | 6.8 | 210 | 290 | o |
| Example 35 | B | 0.50 | 0.40 | 0.10 | 0.0005 | o | 96 | 3.6 | 6.9 | 190 | 310 | o |
| Example 36 | B | 0.45 | 0.35 | 0.20 | 0.0005 | o | 96 | 3.8 | 8.2 | 260 | 300 | o |
| Example 37 | A | 0.30 | 0.60 | 0.10 | 0.0005 | o | 90 | 2.0 | 7.2 | 200 | 430 | o |
| Example 38 | A | 0.25 | 0.50 | 0.25 | 0.0005 | o | 91 | 4.8 | 9.4 | 180 | 370 | o |
| Example 39 | B | 0.25 | 0.70 | 0.05 | 0.0005 | o | 97 | 4.6 | 8.2 | 175 | 440 | o |
| Comparative Example 18 | A | 0.80 | 0.10 | 0.10 | 0.0005 | o | 90 | 0.2 | 3.7 | 130 | 70 | o |
| Comparative Example 19 | A | 0.50 | 0.10 | 0.40 | 0.0005 | o | 90 | 0.4 | 4.0 | 45 | 240 | o |
| Comparative Example 20 | B | 0.20 | 0.70 | 0.10 | 0.0005 | o | 96 | 9.0 | 20.9 | 40 | 510 | Δ |
| Comparative Example 21 | A | 0.10 | 0.10 | 0.80 | 0.0005 | x | 81 | 8.8 | 20.0 | Unable to be evaluated | Unable to be evaluated | Not evaluated |

The results of the X-ray fluorescence analysis revealed that the compositions as weighed were kept even after the sintering.

In the structure evaluations, the structure analysis using X-ray diffraction revealed that the crystal structure was only the perovskite-type structure except for Comparative Example 20. The samples of Examples exhibited satisfactory insulation property such as exhibiting a resistance of several minutes to several tens of minutes or more to a DC electric field of 50 kV/cm or more. In addition, the samples of Examples exhibited as high piezoelectric performance as $d_{33}$*=125 pm/V or more, and had a Curie temperature of 200° C. or more.

The results reveal that the density was a relative density of 90% or more in each of the samples having only the perovskite-type structure, and the relative density became higher (96% or more) in the case of employing the tape casting method. In addition, in the samples of Examples, the average equivalent circular diameter of the crystal grain was 0.8 μm or more and 4.8 μm or less, and the maximum equivalent circular diameter of the crystal grain was 5.9 μm or more and 9.4 μm or less.

Liquid Discharge Head

Through the use of the piezoelectric material of Example 12, the liquid discharge head illustrated in FIGS. 4A and 4B was manufactured. It was confirmed that ink was discharged in accordance with an input electric signal.

Ultrasonic Motor Through the use of the piezoelectric material of Example 11, the ultrasonic motor illustrated in FIGS.

7A and 7B was manufactured. It was confirmed that the motor rotated in accordance with an applied alternating voltage.

Dust Removing Device

Through the use of the piezoelectric material of Example 36, the dust removing device illustrated in FIGS. 10A and 10B was manufactured. Plastic beads were scattered, and an alternating voltage was applied. Then, it was confirmed that the dust was removed with sufficient dust removing efficiency.

INDUSTRIAL APPLICABILITY

According to the present invention, it is possible to provide the piezoelectric material having high piezoelectric performance without ingredients harmful to the environment. In addition, the present invention can provide the piezoelectric element, the liquid discharge head, the ultrasonic motor, and the dust removing device, which use the piezoelectric material.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-057403, filed on Mar. 14, 2012, which is hereby incorporated by reference herein in its entirety.

REFERENCE SIGNS LIST 101 piezoelectric element
102 individual liquid chamber
103 diaphragm
104 liquid chamber partition wall
105 ejection port
106 communicating hole
107 common liquid chamber
108 buffer layer
1011 first electrode
1012 piezoelectric material
1013 second electrode
201 oscillator
202 rotor
203 output shaft
204 oscillator
205 rotor
206 spring
2011 elastic ring
2012 piezoelectric element
2013 organic adhesive
2041 metal elastic body
2042 multilayered piezoelectric element
310 dust removing device
320 diaphragm
330 piezoelectric element
331 piezoelectric material
332 first electrode
333 second electrode
336 first electrode plane
337 second electrode plane

The invention claimed is:
1. A piezoelectric material, comprising a perovskite-type metal oxide represented by general formula (1):

$$xBaTiO_3\text{-}yBiFeO_3\text{-}zBi(M_{0.5}Ti_{0.5})O_3 \qquad (1),$$

where M represents at least one kind of element selected from the group consisting of Mg, Ni, and Zn, x represents a value satisfying $0.25 \leq x \leq 0.75$, y represents a value satisfying $0.15 \leq y \leq 0.73$, and z represents a value satisfying $0.02 \leq z \leq 0.60$, provided that $x+y+z=1$ is satisfied, wherein the perovskite-type metal oxide contains V, and content of the V is 0.0005 mol or larger and 0.0050 mol or smaller with respect to 1 mol of the perovskite-type metal oxide.

2. The piezoelectric material according to claim 1, wherein x satisfies $0.25 \leq x \leq 0.55$, y satisfies $0.20 \leq y \leq 0.73$, and z satisfies $0.02 \leq z \leq 0.25$ in the general formula (1).

3. The piezoelectric material according to claim 1,
wherein the piezoelectric material comprises a ceramics,
wherein the ceramics is formed of a crystal grain having an average equivalent circular diameter of 500 nm or larger and 5 μm or smaller, and
wherein the crystal grain has a maximum equivalent circular diameter of 5 μm or larger and 10 μm or smaller.

4. A piezoelectric element, comprising:
a first electrode;
a piezoelectric material; and
a second electrode,
wherein the piezoelectric material comprises the piezoelectric material according to claim 1.

5. A liquid discharge head, comprising:
a liquid chamber comprising a vibrating unit including the piezoelectric element according to claim 4; and
an ejection port communicating to the liquid chamber.

6. A liquid discharge device, comprising:
a conveying portion for a recording medium; and
the liquid discharge head according to claim 5.

7. An ultrasonic motor, comprising:
a vibrating member including the piezoelectric element according to claim 4; and
a rotor to be brought into contact with the vibrating member.

8. An optical apparatus, comprising a drive unit including the ultrasonic motor according to claim 7.

9. A vibratory device, comprising a vibrating member including the piezoelectric element according to claim 4.

10. A dust removing device, comprising a vibrating member including the piezoelectric element according to claim 4.

11. An image pickup device, comprising:
the dust removing device according to claim 10; and
an image pickup element unit,
wherein the dust removing device includes a vibration member disposed on a light receiving surface side of the image pickup element unit.

12. An electronic apparatus, comprising a piezoelectric acoustic component including the piezoelectric element according to claim 4.

13. A multilayered piezoelectric element, comprising a piezoelectric material layer and an electrode including an internal electrode, which are alternately stacked,
wherein the piezoelectric material layer is formed of the piezoelectric material according to claim 1.

14. The multilayered piezoelectric element according to claim 13,
wherein the internal electrode comprises Ag and Pd, and
wherein a weight ratio M1/M2 of a content weight M1 of the Ag to a content weight M2 of the Pd satisfies $1.5 \leq M1/M2 \leq 9.0$.

15. The multilayered piezoelectric element according to claim 13, wherein the internal electrode contains at least one of Ni and Cu.

16. A liquid discharge head, comprising:
   a liquid chamber comprising a vibrating unit including the multilayered piezoelectric element according to claim 13; and
   an ejection port communicating to the liquid chamber.

17. A liquid discharge device, comprising:
   a conveying portion for a recording medium; and
   the liquid discharge head according to claim 16.

18. An ultrasonic motor, comprising:
   a vibrating member including the multilayered piezoelectric element according to claim 13; and
   a rotor to be brought into contact with the vibrating member.

19. An optical apparatus, comprising a drive unit including the ultrasonic motor according to claim 18.

20. A vibratory device, comprising a vibrating member including the multilayered piezoelectric element according to claim 13.

21. A dust removing device, comprising a vibrating member including the multilayered piezoelectric element according to claim 13.

22. An image pickup device, comprising:
   the dust removing device according to claim 21; and
   an image pickup element unit,
   wherein the dust removing device includes a vibration member disposed on a light receiving surface side of the image pickup element unit.

23. An electronic apparatus, comprising a piezoelectric acoustic component including the multilayered piezoelectric element according to claim 13.

* * * * *